(12) United States Patent
Taketani

(10) Patent No.: US 8,373,226 B2
(45) Date of Patent: Feb. 12, 2013

(54) SEMICONDUCTOR DEVICE INCLUDING A TRENCH-GATE FIN-FET

(75) Inventor: Hiroaki Taketani, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 132 days.

(21) Appl. No.: 12/869,214

(22) Filed: Aug. 26, 2010

(65) Prior Publication Data

US 2011/0049599 A1 Mar. 3, 2011

(30) Foreign Application Priority Data

Aug. 31, 2009 (JP) ................................ 2009-199954

(51) Int. Cl.
*H01L 29/66* (2006.01)
(52) U.S. Cl. ............... 257/337; 257/327; 257/E27.091; 257/296; 257/298; 257/E29.201; 257/E21.428
(58) Field of Classification Search .................. 257/296, 257/298, E29.201, E21.428, 337, 327, E29.091
See application file for complete search history.

(56) References Cited

U.S. PATENT DOCUMENTS

| 8,003,485 | B2 * | 8/2011 | Cho et al. ...................... 438/424 |
| 2007/0173007 | A1 * | 7/2007 | Lee et al. ...................... 438/209 |
| 2007/0267691 | A1 * | 11/2007 | Chen et al. ..................... 257/330 |
| 2008/0003753 | A1 * | 1/2008 | Seo et al. ....................... 438/296 |
| 2008/0303085 | A1 * | 12/2008 | Jung et al. ..................... 257/330 |

FOREIGN PATENT DOCUMENTS

| JP | 2005-340840 | 12/2005 |
| JP | 2008-016842 | 1/2008 |
| JP | 2008-021828 | 1/2008 |
| JP | 2008-047909 | 2/2008 |

OTHER PUBLICATIONS

Kedzierski et al., "Extension and Source/Drain Design for High-Performance FinFET Devices"., IEEE Transactions O Electron Devices, vol. 50, No. 4, Apr. 2003.
Chung et al., "Highly Scalable Saddle-Fin(S-Fin) Transistor for Sub-50nm DRAM Technology", 2006 Symposium on VLSI Technology Digest of Technical Papers.

* cited by examiner

*Primary Examiner* — Marcos D. Pizarro
*Assistant Examiner* — Eva Yan Montalvo
(74) *Attorney, Agent, or Firm* — Young & Thompson

(57) ABSTRACT

In Trench-Gate Fin-FET, in order that the advantage which is exerted in Fin-FET can be sufficiently taken even if a transistor becomes finer and, at the same time, decreasing of on-current can be suppressed by saving a sufficiently large contact area in the active region, a fin width 162 of a channel region becomes smaller than a width 161 of an active region.

13 Claims, 41 Drawing Sheets

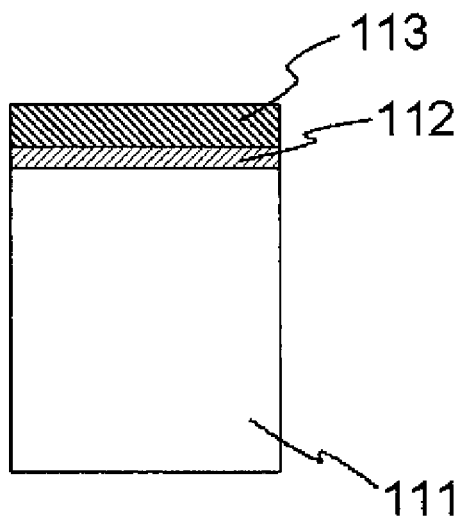
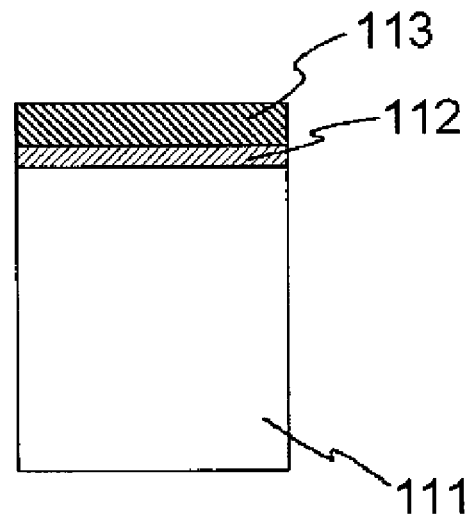
FIG. 2(a)  FIG. 2(b)
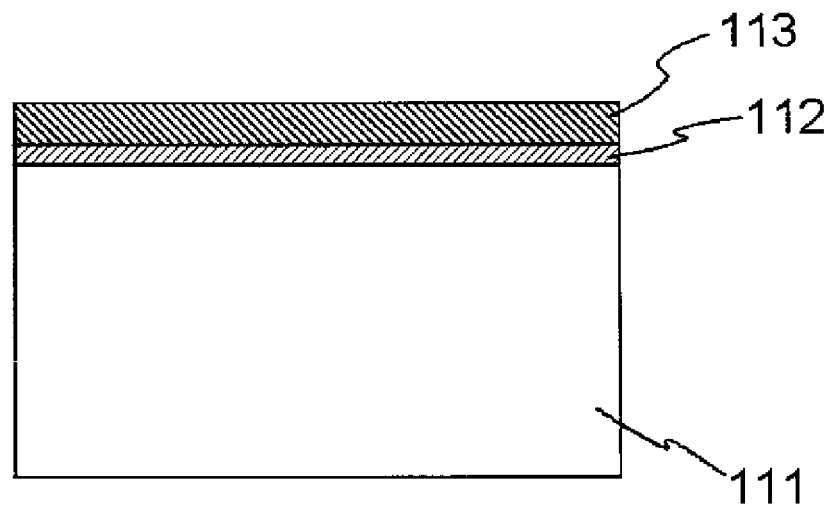
FIG. 2(c)

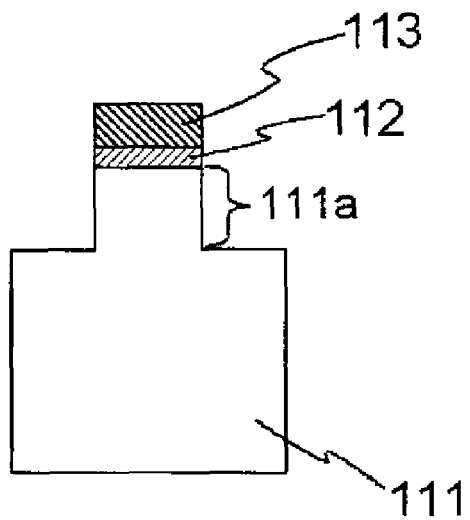
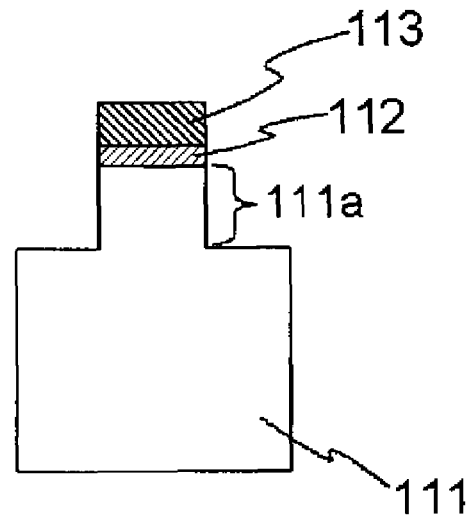
FIG. 4(a)     FIG. 4 (b)
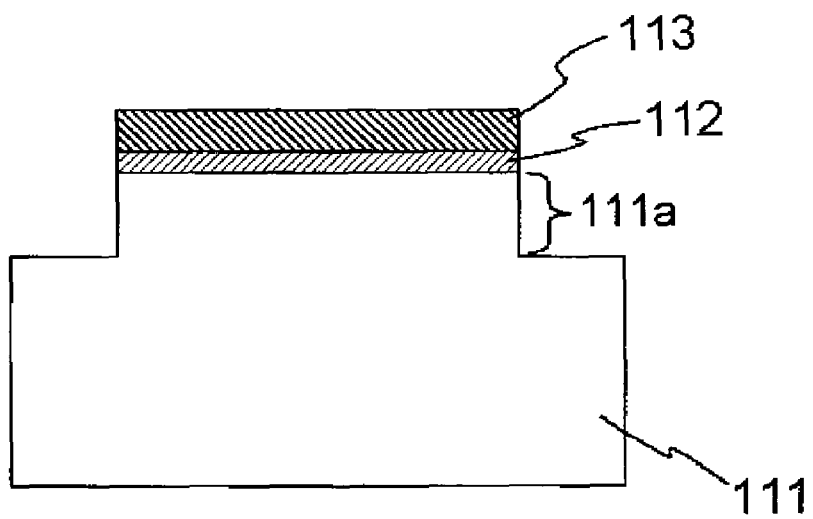
FIG. 4(c)

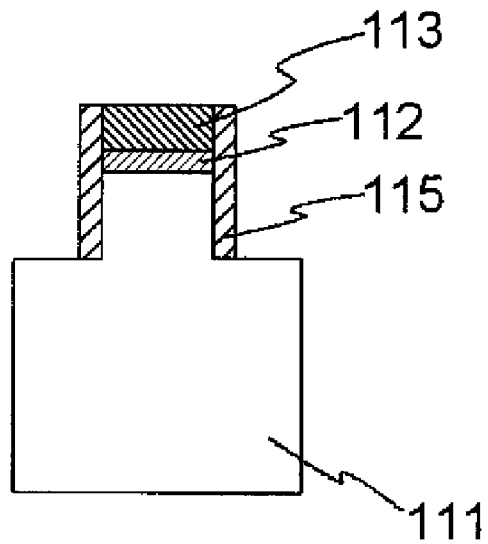 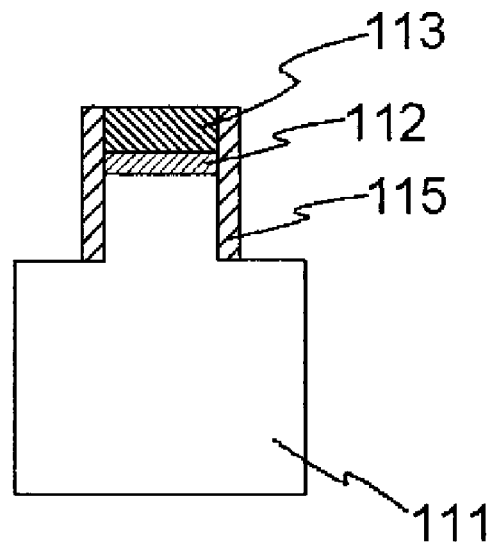
FIG. 6(a)  FIG. 6(b)
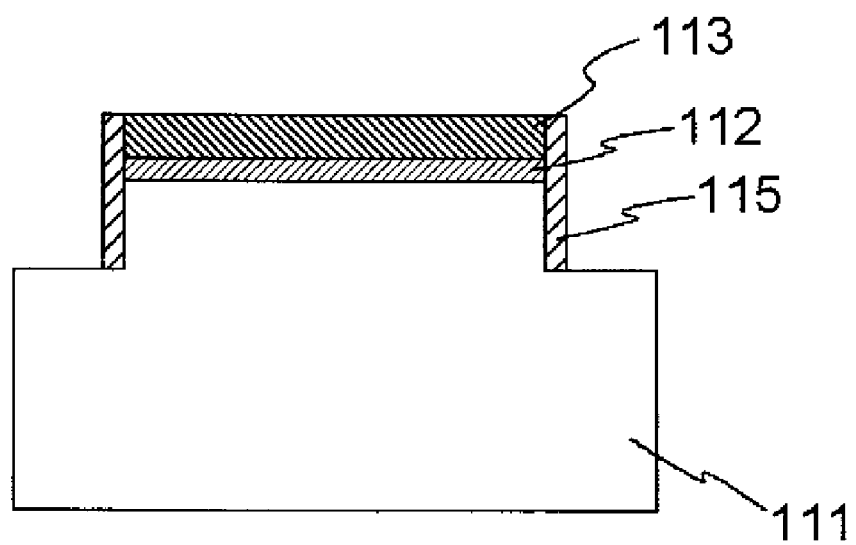
FIG. 6(c)

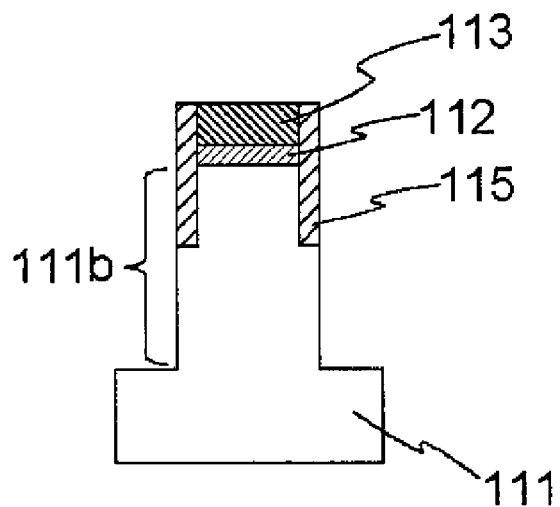
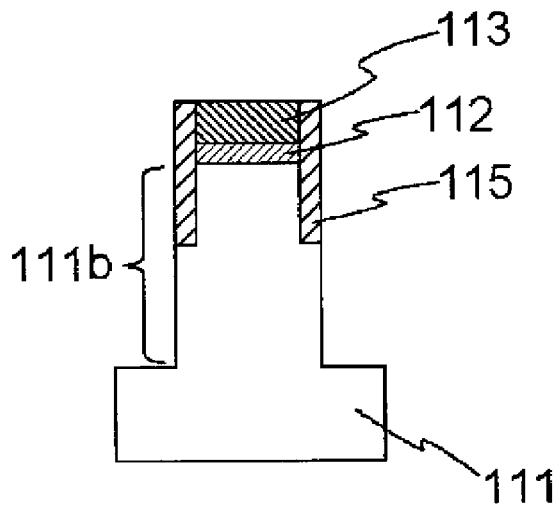
FIG. 7(a)     FIG. 7(b)
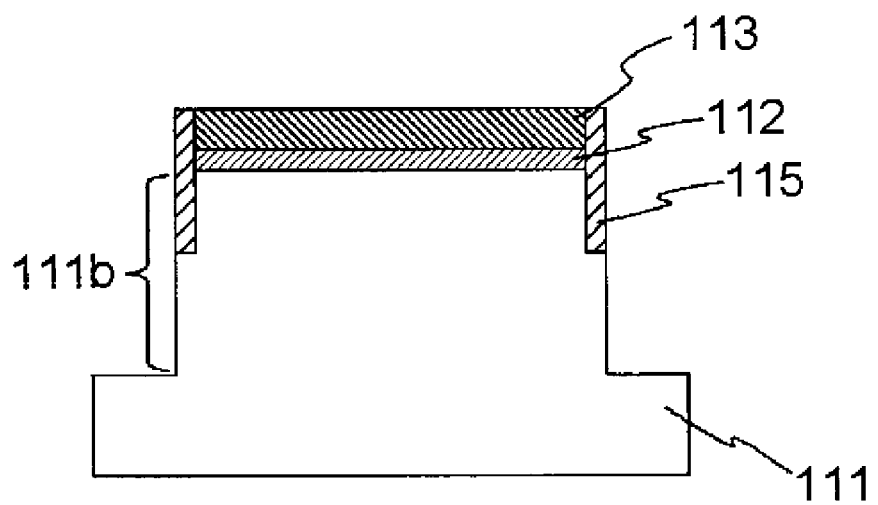
FIG. 7(c)

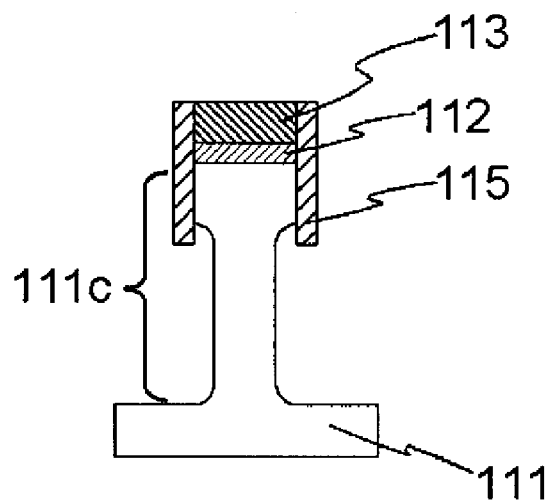
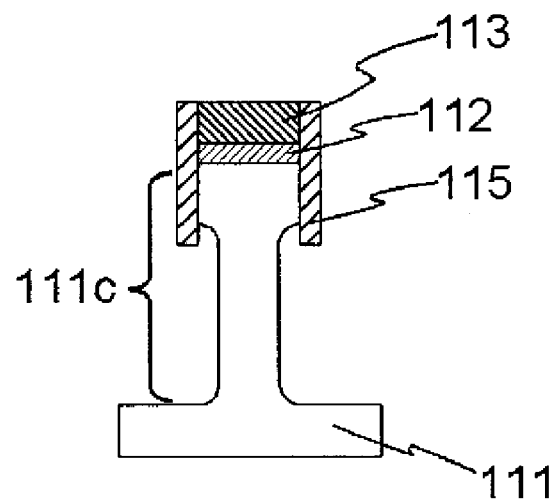
FIG. 8(a)  FIG. 8(b)
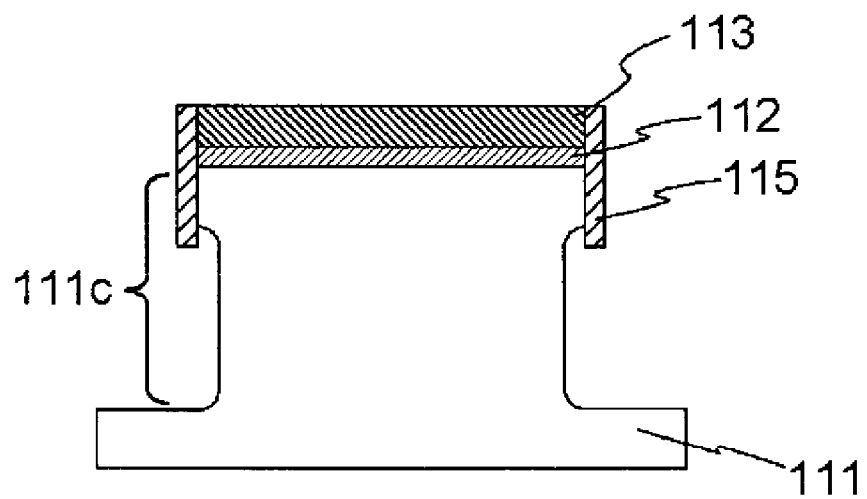
FIG. 8(c)

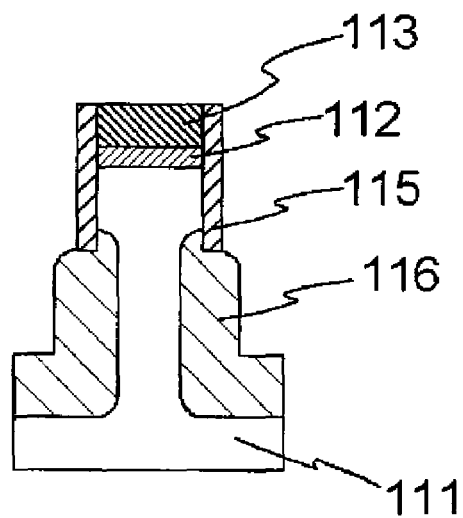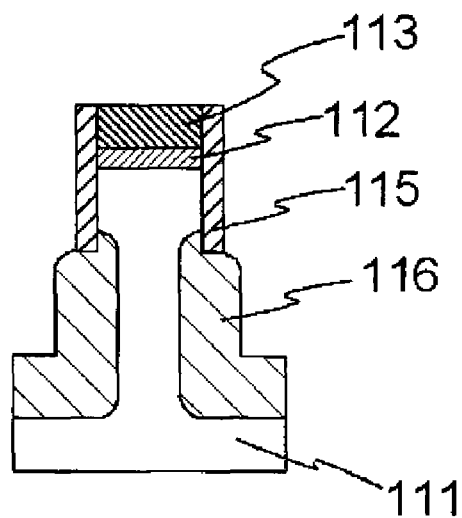
FIG. 9(a)  FIG. 9(b)
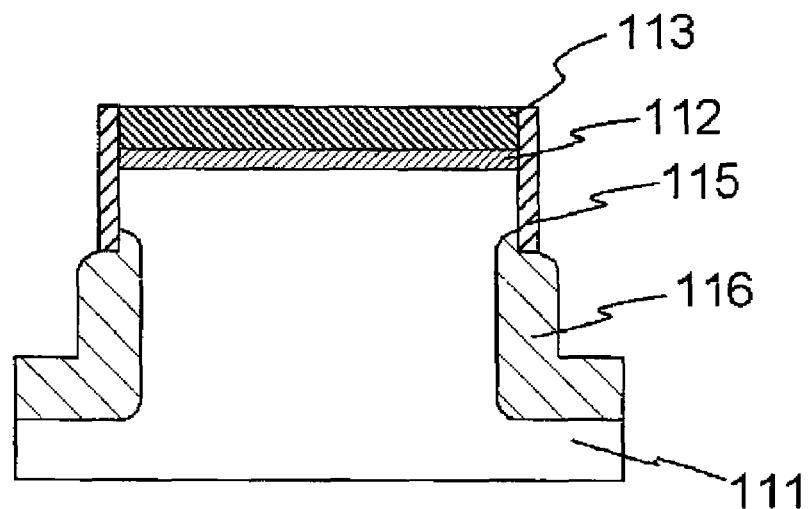
FIG. 9(c)

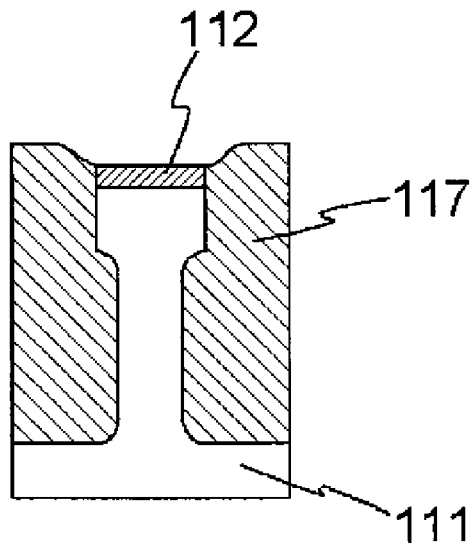 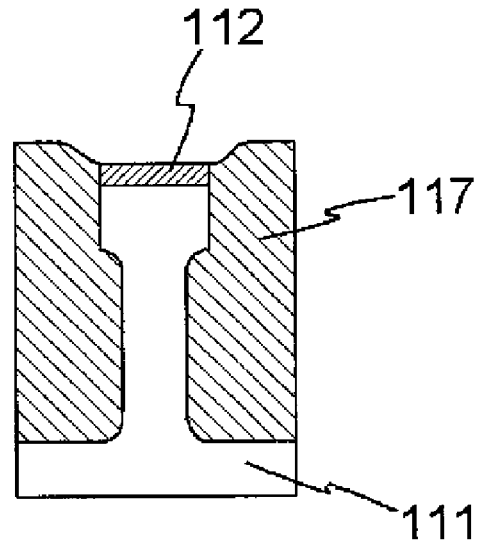
FIG. 11(a)　　　　　　FIG. 11(b)
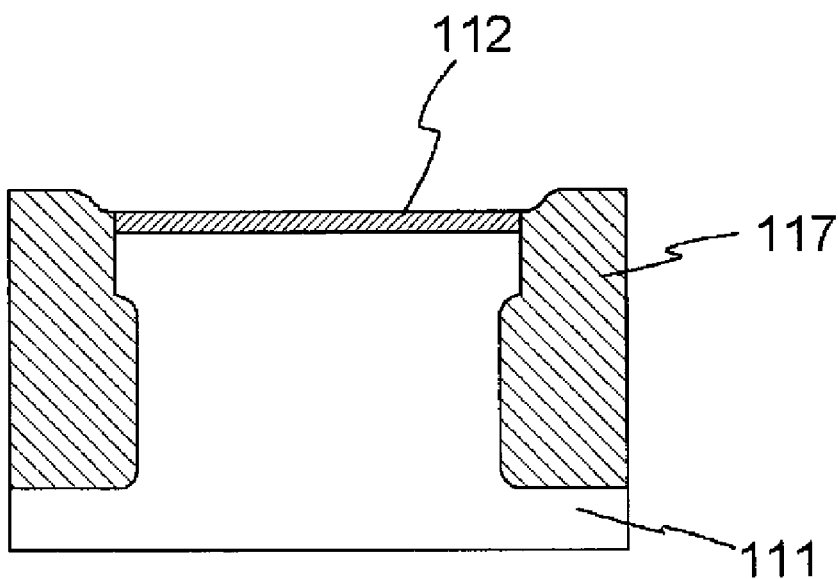
FIG. 11(c)

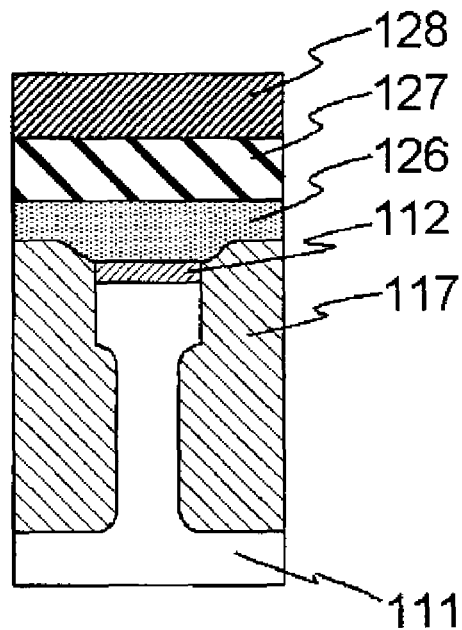
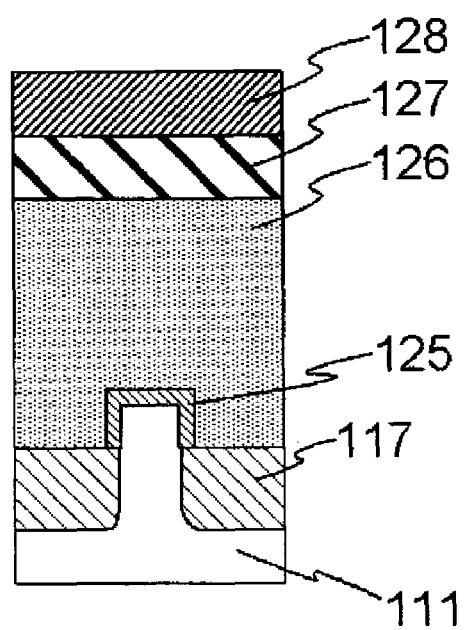
FIG. 15(a)    FIG. 15(b)
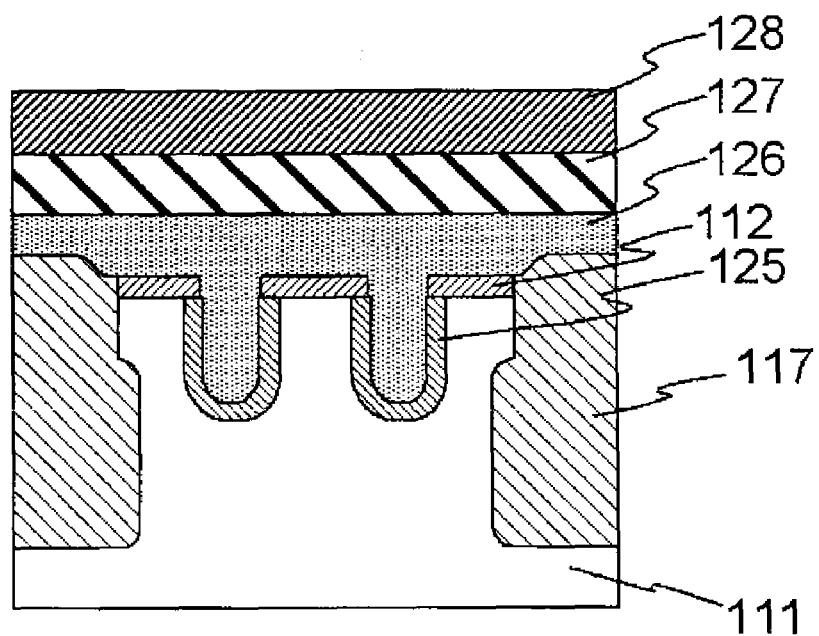
FIG. 15(c)

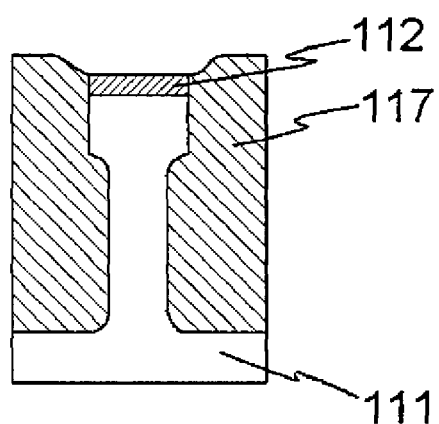 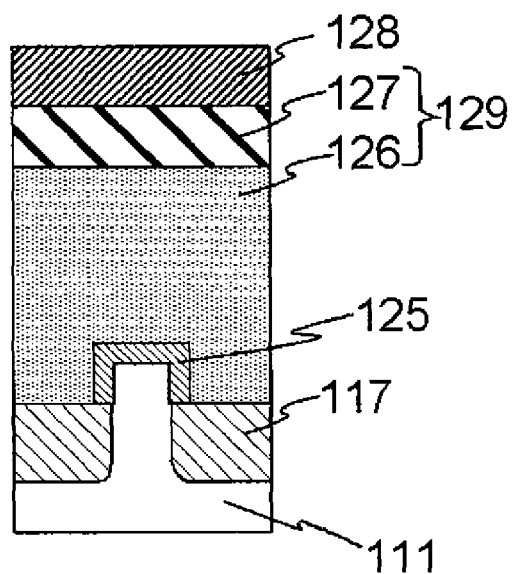
FIG. 16(a)   FIG. 16(b)
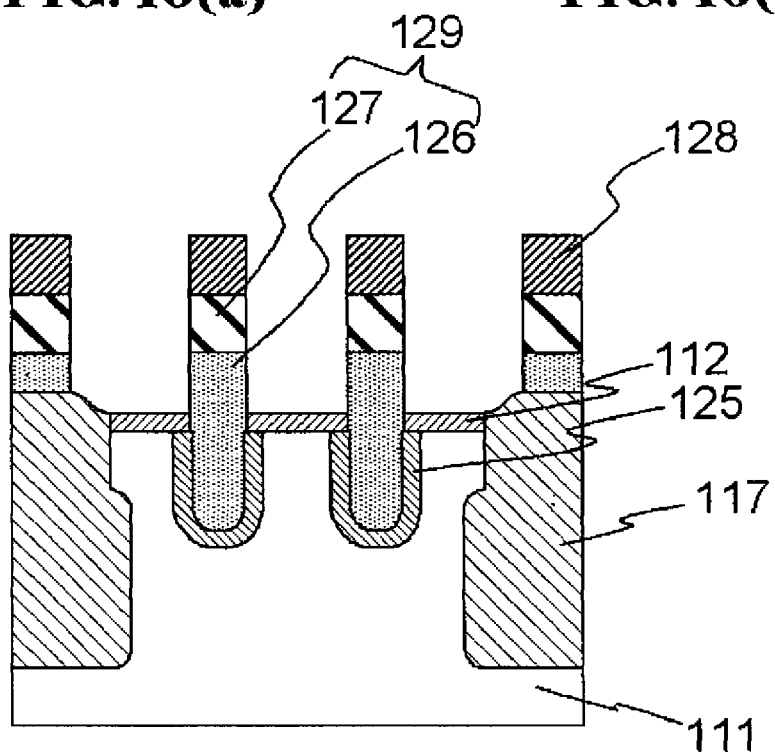
FIG. 16(c)

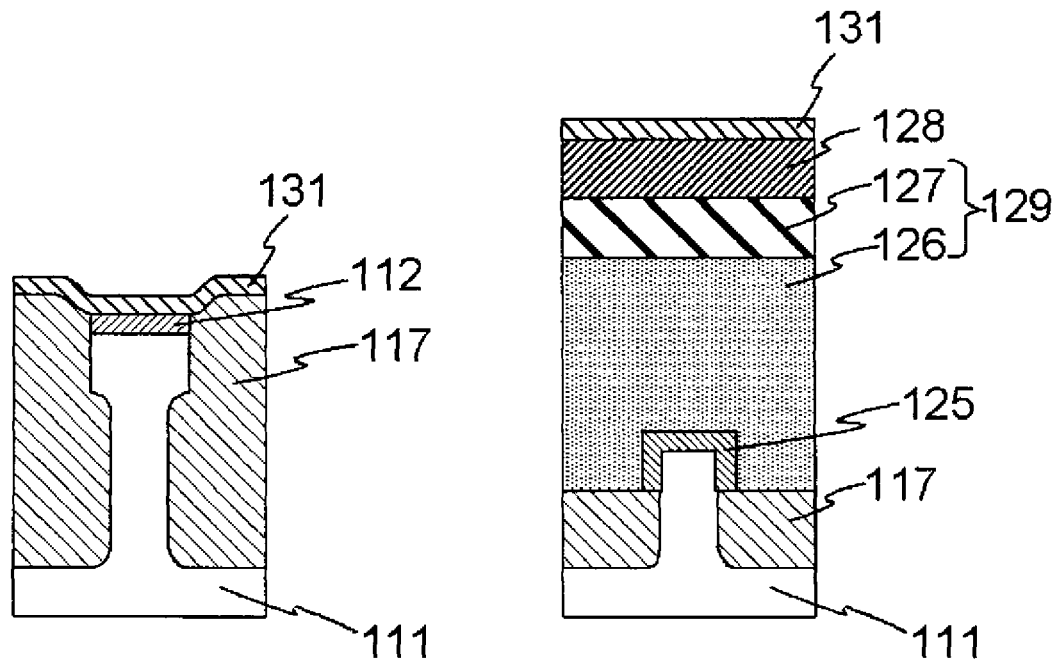
FIG. 17(a)
FIG. 17(b)
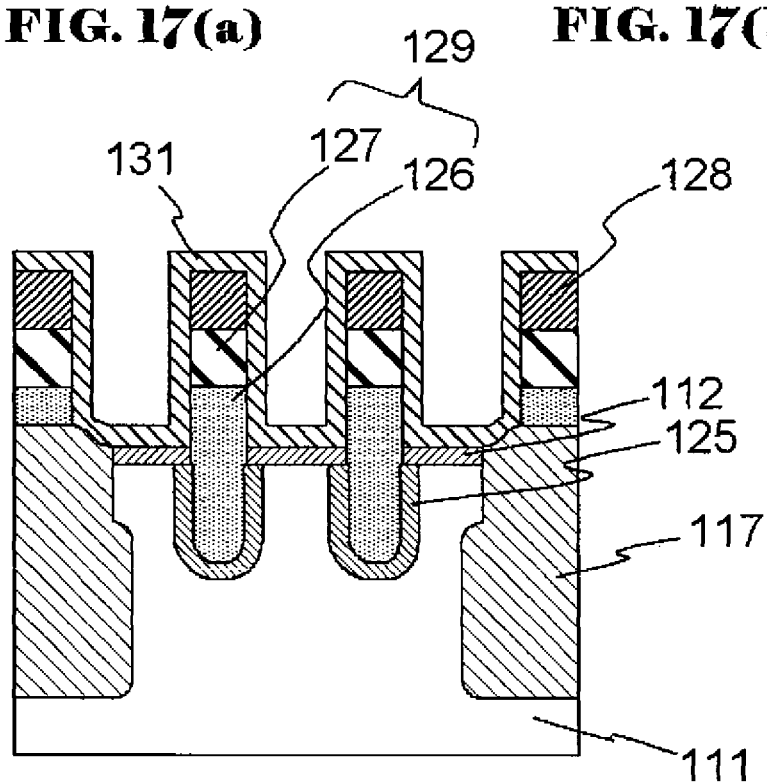
FIG. 17(c)

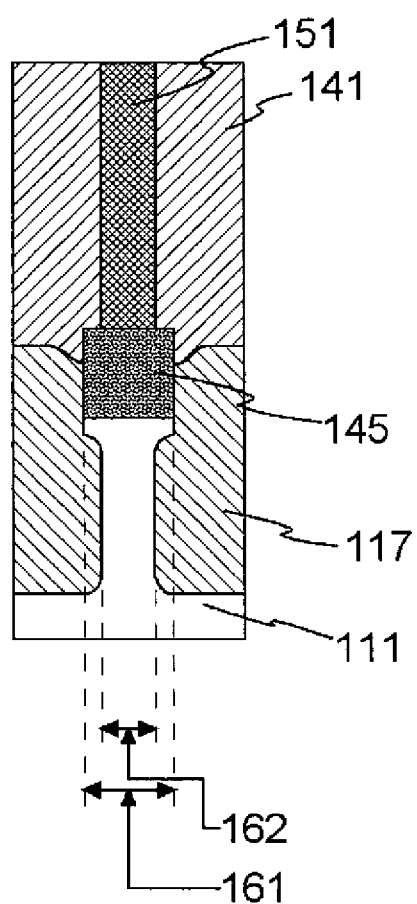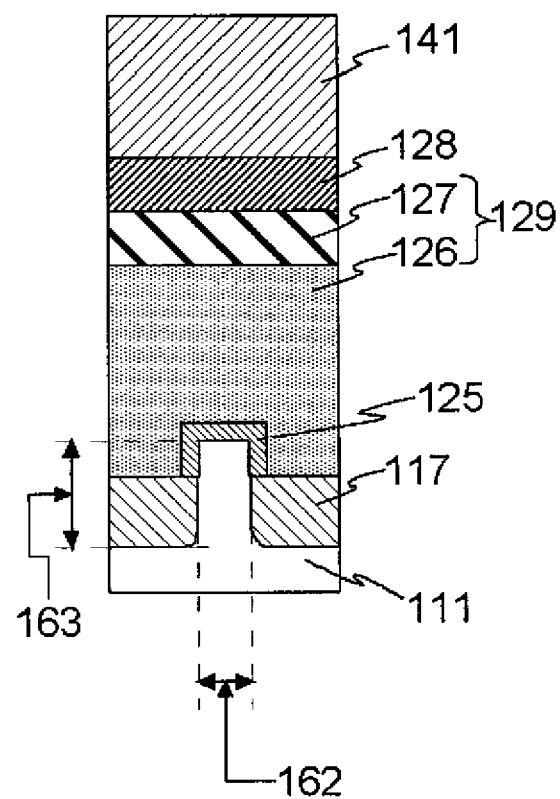
FIG. 22(a)  FIG. 22(b)

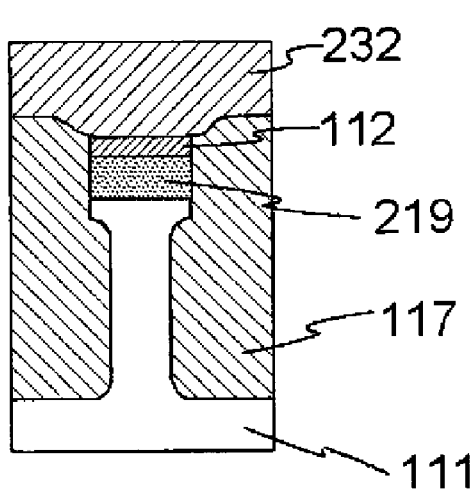
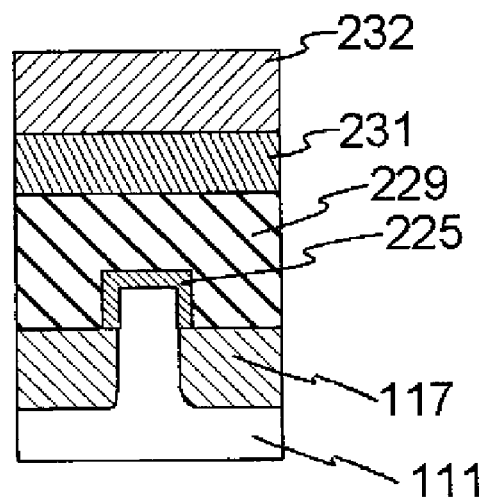
FIG. 36(a)   FIG. 36(b)
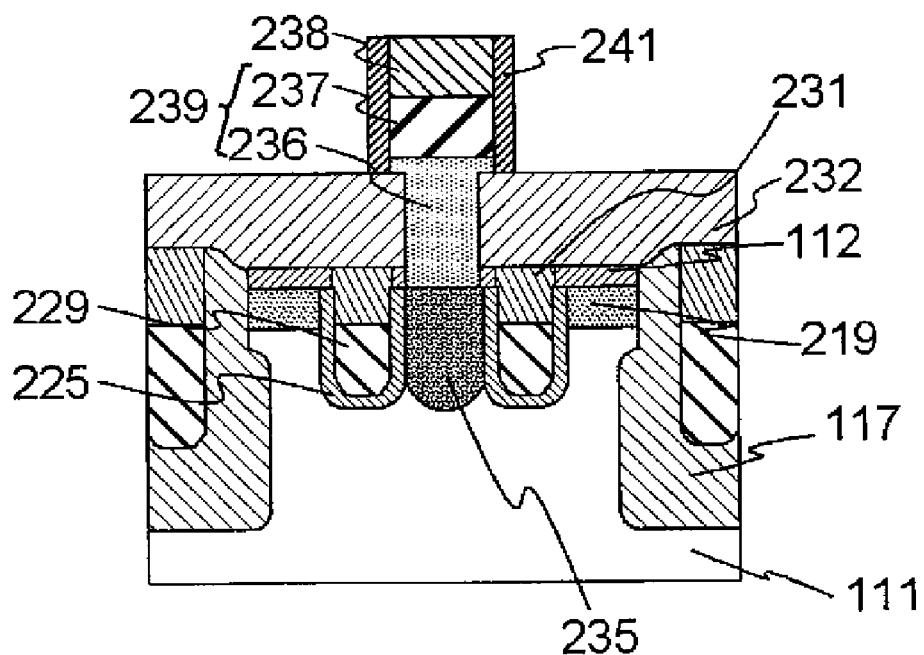
FIG. 36(c)

SEMICONDUCTOR DEVICE INCLUDING A TRENCH-GATE FIN-FET

BACKGROUND OF THE INVENTION

1. Field of the Invention

The present invention relates to a semiconductor device, and more particularly to a semiconductor device including a trench gate fin field effect transistor (Trench-Gate Fin-FET).

2. Description of the Related Art

Recently, with a miniaturization of a transistor, it is being problematic that due to a so-called short channel effect, threshold voltage becomes lower and sub-threshold voltage characteristic becomes deteriorated. As a high-performance transistor suppressing such a problem, a fin field effect transistor (Fin-FET) has been remarked whose channel is fabricated in fin shape. Further, in order to use the Fin-FET as a transistor with a low leakage requirement such as a cell transistor of a dynamic random access memory (DRAM), Trench-Gate Fin-FET (also called as a saddle Fin-FET) is set forth which combines a trench gate structure with the fin structure (Japanese Patent Laid-Open No. 2008-47909, Japanese Patent Laid-Open No. 2008-16842, S-W Chung, et. al., *Symposium on VLSI Tech. Dig.*, pp. 32-33, 2006, etc).

It is known that when a fin width becomes one-half or less of an effective channel length in the Fin-FET, performance of the Fin-FET becomes better (J. Kedzierski, et. al., *IEEE Trans. Electron Device*, vol. 50, pp 952-958, April 2003). However, in the Trench-Gate Fin-FET, a width of an active region itself becomes a fin width, and, hence, the fin width becomes larger relative to the effective channel length. That is, the advantage which occurred at the Fin-FET in making the transistor smaller may not be sufficiently taken.

Moreover, if the width of the entire active region becomes smaller in order to make the fin width smaller, contact resistance increases as a contact area is smaller, and, further, on-current decreases as an effective channel width becomes smaller. Especially in a semiconductor device with an embedded gate structure where resistance of a source and drain diffusion layer is high, such decreasing of the on-current becomes more outstanding when making the width of the active region smaller.

Accordingly, there exists a need to provide Trench-Gate Fin-FET where the advantage which shall be exerted in the Fin-FET can be sufficiently taken even if the transistor becomes finer and, at the same time, such decreasing of the on-current can be suppressed by saving a sufficiently large contact area in the active region.

SUMMARY OF THE INVENTION

According to an exemplary embodiment of the invention, there is provided a semiconductor device including trench gate fin field effect transistor (Trench-Gate Fin-FET), which includes: on a semiconductor substrate, a semiconductor region of Fin structure defined by device isolation, and a gate electrode formed in the semiconductor region and within a trench which intersects the semiconductor region, wherein in the semiconductor region of the Fin structure, a fin width of at least a portion of a lower channel region is smaller than a width of an upper active region.

In addition, according to another exemplary embodiment of the invention, there is provided a semiconductor memory device including Trench-Gate Fin-FET as a memory cell transistor, which includes: on a semiconductor substrate, a semiconductor region of Fin structure defined by device isolation, and a gate electrode formed in the semiconductor region and within a trench which intersects the semiconductor region, wherein in the semiconductor region of the Fin structure, a fin width of at least a portion of a lower channel region is smaller than a width of an upper active region.

According to an exemplary embodiment of the present invention, in the Trench-Gate Fin-FET, by making the fin width of the channel region relative to an effective channel length smaller, the advantage which shall be exerted in the Fin-FET can be sufficiently taken even if the transistor becomes finer. At the same time, because the width of the active region can be larger than the width of the channel region, the decreasing of the on-current due to the increasing of the contact resistance following the miniaturization of the transistor can be suppressed.

BRIEF DESCRIPTION OF THE DRAWINGS

The above features and advantages of the present invention will be more apparent from the following description of certain preferred embodiments taken in conjunction with the accompanying drawings, in which:

FIG. 2 to FIG. 8, FIG. 10 to FIG. 12, and FIG. 14 to FIG. 21 are cross-sectional views of processes showing manufacturing processes according to a first exemplary embodiment of the present invention;

FIG. 9 is a cross-sectional view of a process showing a manufacturing process according to a variant of the first exemplary embodiment; and in which figures (a), (b), and (c) correspond to cross-sections taken in lines A-A', B-B' and C-C' of FIG. 1, respectively;

FIG. 22 is a cross-sectional view illustrating respective sizes of various portions in Fin structure according to the first exemplary embodiment; and in which figures (a) and (b) correspond to cross-sections taken in lines A-A' and B-B' of FIG. 1, respectively;

DETAILED DESCRIPTION OF THE REFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purpose.

In this specification, "a width of an active region" means, when a semiconductor region of the Fin structure is seen from above, a width of a surface of the semiconductor region, and "a width of a channel region" means a width of a portion of a channel region at which a fin width is smallest within the channel region formed between source and drain diffusion layers of Trench-Gate Fin-FET and running around a trench gate.

First Exemplary Embodiment

In a first exemplary embodiment, a semiconductor device as the Trench-Gate Fin-FET is set forth in which the width of the active region is 60 nm and the width of the channel region is 30 nm.

Figure 1:
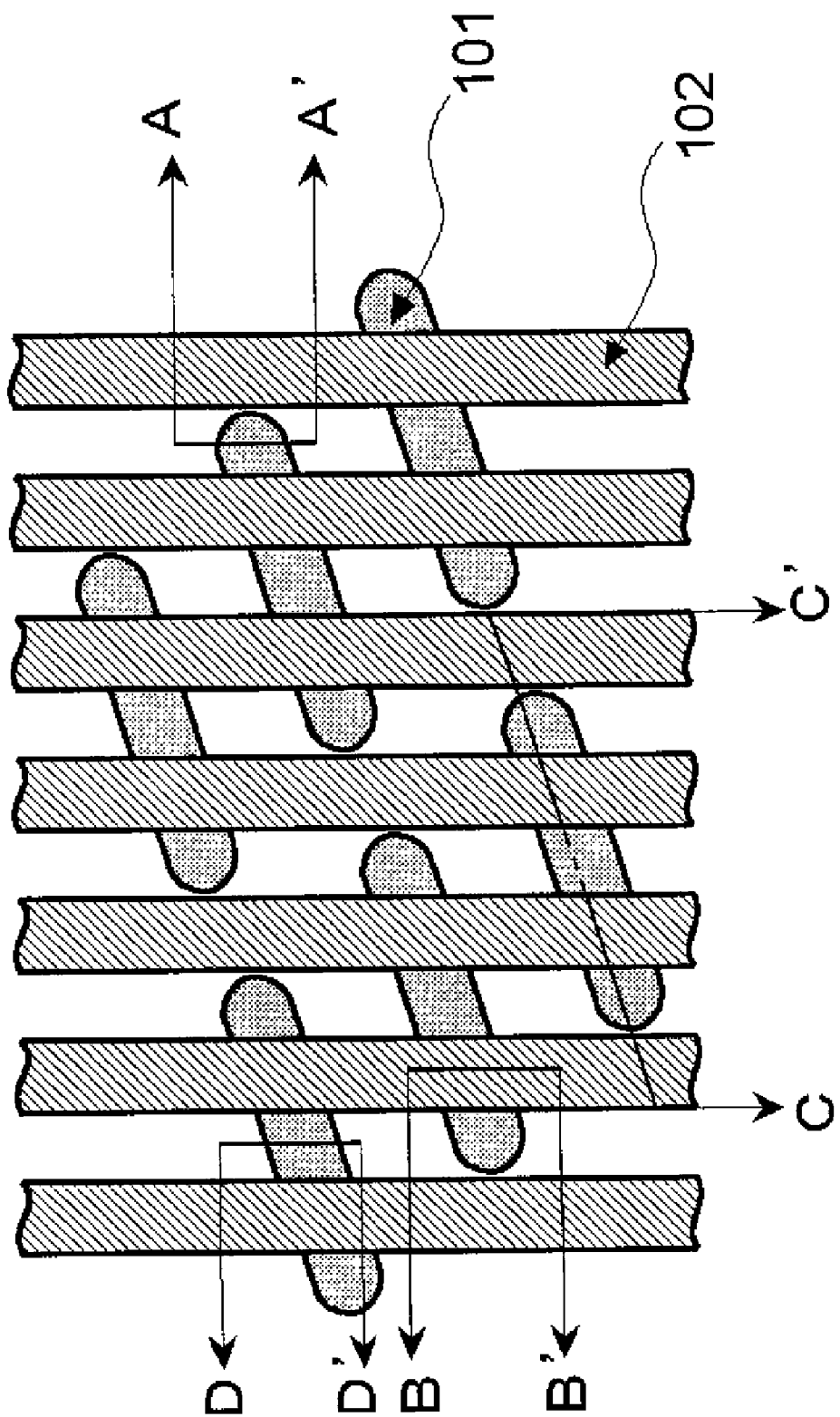
FIG. 1 is a plan view showing a portion of a memory cell region of DRAM according to an exemplary embodiment of the present invention.

In the first exemplary embodiment, an example is described referring to the figures in which the present invention, i.e., the semiconductor device is used as a memory cell transistor of DRAM including n-MOS-FET structure. FIG. 1 is a plan view showing a portion of a memory cell region of the DRAM according to an exemplary embodiment of the present invention. FIG. 2 to FIG. 8, FIG. 10 to FIG. 12, and FIG. 14 to FIG. 21 are cross-sectional views of processes showing manufacturing processes according to the first exemplary embodiment of the present invention; FIG. 9 is a cross-sectional view of a process showing a manufacturing process according to a variant of the first exemplary embodiment; and in which figures (a) and (b) show cross-sections of the Trench-Gate Fin-FET of FIG. 1 taken in lines A-A' and B-B respectively and parallel to gate electrode 102 while a figure (c) show a cross-section of the Trench-Gate Fin-FET of FIG. 1 taken in a line C-C' and parallel to active region 101.

As a first step, as shown in FIG. 2, p-type silicon substrate 111 is subject to a conventional thermal oxidation and, thus, silicon oxide film 112 has been grown with a thickness of 10 nm. Thereafter, silicon nitride film 113 is deposited with a thickness of 150 nm by LP-CVD method.

Figure 3A:
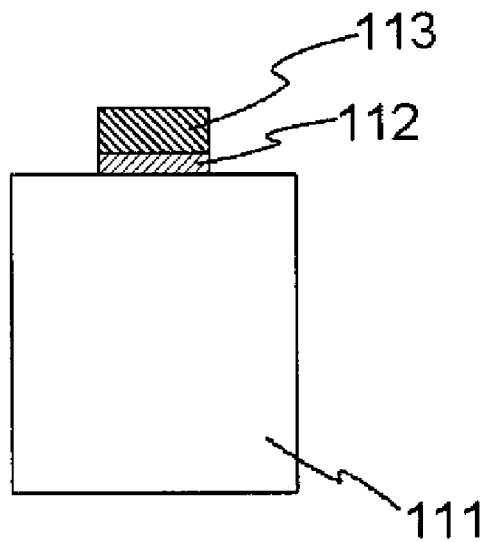
Figure 3B:
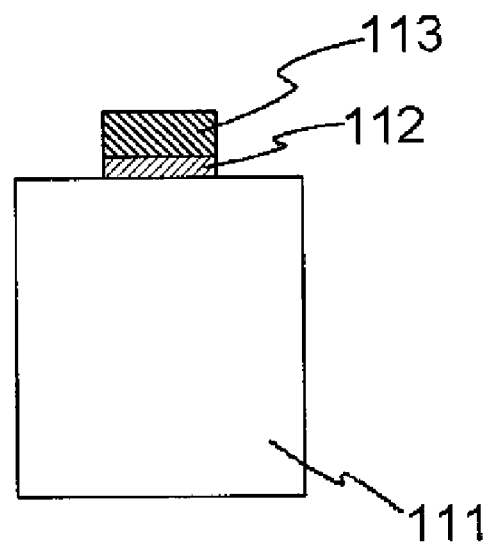
Figure 3C:
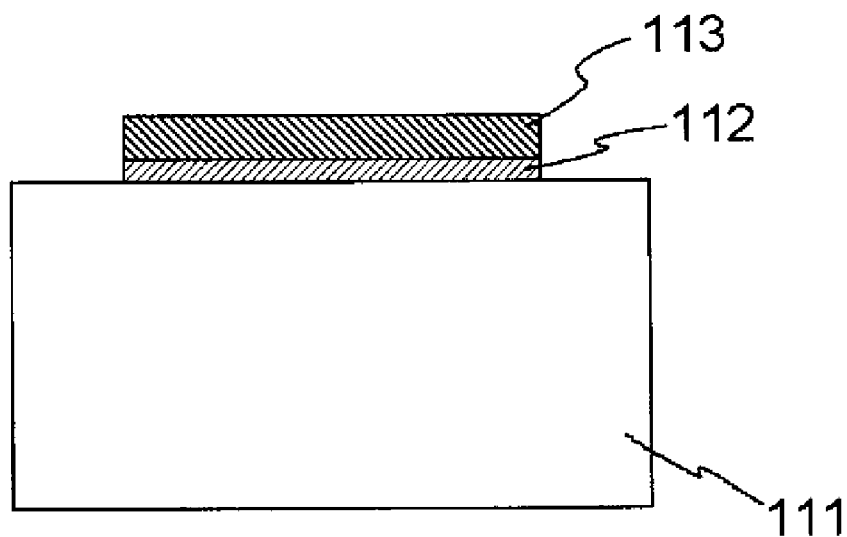

Then, as shown in FIG. 3, silicon oxide film 112 and silicon nitride film 113 are patterned by well-known lithography and dry etching techniques so that an active region is formed with a width of 60 nm.

As shown in FIG. 4, silicon substrate 111 is etched away by a depth of 100 nm using silicon nitride 113 as a mask, and, thus, first Fin structure 111a is formed.

Figure 5A:
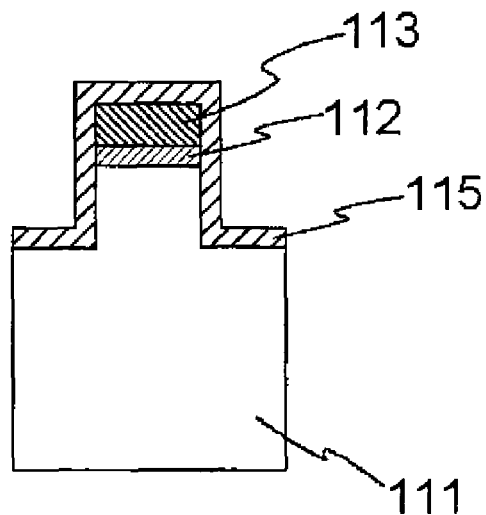
Figure 5B:
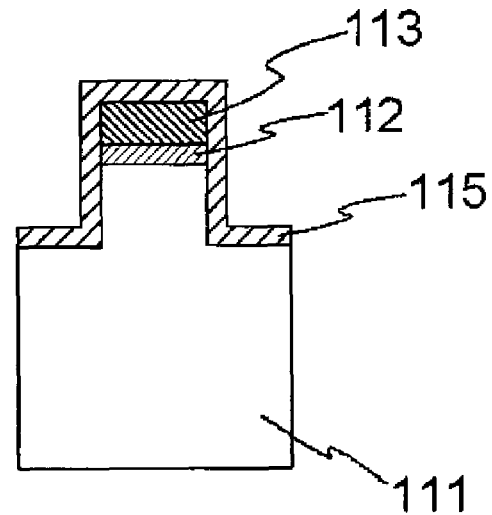
Figure 5C:
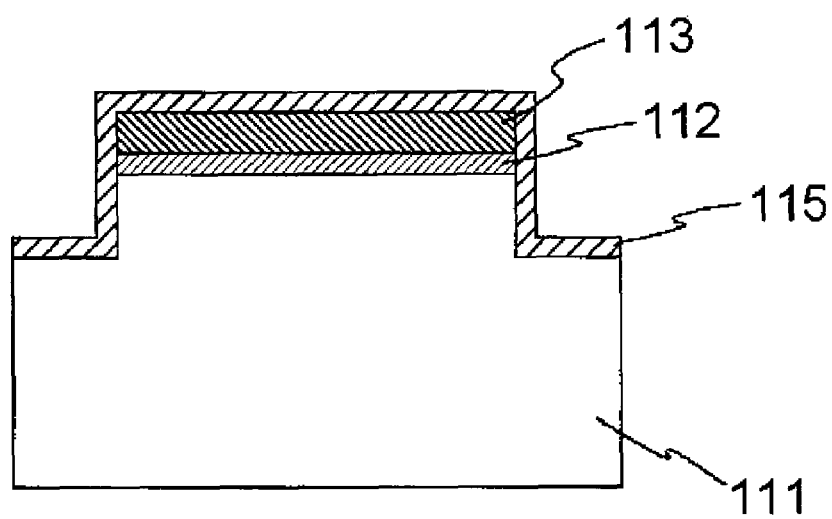

As shown in FIG. 5, silicon nitride film 115 is deposited with a thickness of 10 nm by LP-CVD method.

As shown in FIG. 6, silicon nitride film 115 is etched back by a well-known dry etching technique, so that side wall spacers are formed on side faces of first Fin structure 111a.

As shown in FIG. 7, silicon substrate 111 is etched away by a depth of 100 nm using silicon nitride films 113, 115 as a mask to form a recess (trench) for device isolation each other using STI (Shallow Trench Isolation) structure, and to form second Fin structure 111b.

Thereafter, as shown in FIG. 8, silicon substrate 111 is etched away by a width of 25 nm by an isotropic etching using aqueous solution including, for example, ammonia ($NH_3$) to form third Fin structure 111c. Here, silicon nitrides 113, 115 are substantially not etched away, and, hence, only the silicon substrate can be selectively etched away. Because an etching rate of the silicon substrate by such an isotropic etching is already experimentally known, etched silicon quantity can be adjusted by controlling an etching time. Moreover, such an isotropic etching method may include, as will be explained later, a method of forming in advance a thermal oxidation film and, then, removing the thermal oxidation film with hydrofluoric acid (HF) solution or CDE (Chemical Dry Etching) method.

Here, a variant example is explained which forms in advance a thermal oxidation film and, then, removes the thermal oxidation film with solution containing hydrofluoric acid. As shown in FIG. 9, after second Fin structure 111b shown in FIG. 7 is formed, silicon oxide film 116 is formed with a thickness of 50 nm on exposed surfaces of the silicon substrate by a thermal oxidation method. As is well-known, in forming the thermal oxidation film, silicon is consumed by a thickness corresponding to a half of a thickness of the formed thermal oxidation film, so that thicknesses of the surfaces of the silicon substrate are reduced to 25 nm after the thermal oxidation film is formed. After silicon oxide film 116 is formed, this silicon oxide film 116 is wet-etched away using hydrofluoric acid aqueous solution ($HF/H_2O$) or solution ($HF/NH_4F/H_2O$) in which ammonium fluoride is mixed into the hydrofluoric acid aqueous solution or the like. Because the silicon is not etched away by such etching solutions, the etching process can be stopped at the time when the silicon substrate is exposed. That is, reduced quantity of the silicon can be controlled by adjusting a thickness of the formed thermal oxidation film with the thermal oxidation method in which the thickness of the formed thermal oxidation film can be accurately controlled, so that an advantage may be obtained that third Fin structure 111c is formed with high precision.

On the other hand, in case of using CDE method, it is carried out in following manner. In this example of CDE method, ammonia ($NH_3$) gas and hydrogen fluoride (HF) gas can be employed. After silicon oxide film 116 is formed in the above way, silicon substrate 111 is placed into a reaction chamber and, then, temperature of the chamber is kept up at 35° C. Thereafter, ammonia ($NH_3$) gas and hydrogen fluoride (HF) gas are injected into the chamber so that quantities (for example, 40 sccm) of the injected $NH_3$ and HF gases are equal each other, and, then, pressure of the chamber is kept up at 2.67 Pa (20 mTorr) for 60 seconds. In this way, ammonium hexafluorosilicate (($NH_4)_2SiF_6$) which is able to be sublimated is precipitated on the surfaces. Thereafter, the precipitated ammonium hexafluorosilicate on the surfaces is removed by increasing the temperature of silicon substrate 111 up to 150-200° C. and, thus, sublimating ammonium hexafluorosilicate. Under this condition, 5 nm of the thickness of the silicon oxide film is able to be removed. Although adjusting such a condition so as to increase reduced quantity of the silicon, the maximum of the reduced quantity is limited to one and a half of the above-mentioned reduced quantity. Therefore, in order to remove all of 50 nm of the thickness of silicon oxide film 116, such a treatment is repeated 10 times. Because both of the silicon and silicon nitride film are not etched away in this CDE method, an advantage may be obtained that an excessive etching does not occur. That is to say, when a semiconductor device is more miniaturized and, thus, the thicknesses of silicon nitride films 113 and 115 used as the etching mask should be smaller, so that it is problematic in the wet-etching method using the HF solution that all of the silicon nitride films may be removed. On the other hand, in this CDE method, the silicon nitride films are not etched away and, hence, third Fin structure 111c with high precision can be formed even with the thinner silicon nitride films. In the meanwhile, in case that a thickness of the silicon oxide film to be removed is just 4 nm, all of this 4 mm thickness can be removed by carrying out CDE treatment just one time, but, in case of the present example, to be specific, in case that a thickness of the silicon oxide film to be removed is 50 nm, CDE treatment should be carried out several times. As an alternative, in case of the present example, instead of removing all of the 50 nm of the thickness of the silicon oxide film only by CDE method, some of the thickness of silicon oxide film 116 is, in advance, etched away by the wet-etching method using the solution containing HF to the extent that all of the silicon nitride film is not removed, and, then, the other of the thickness of the silicon oxide film is etched away by CDE method.

Figure 10A:
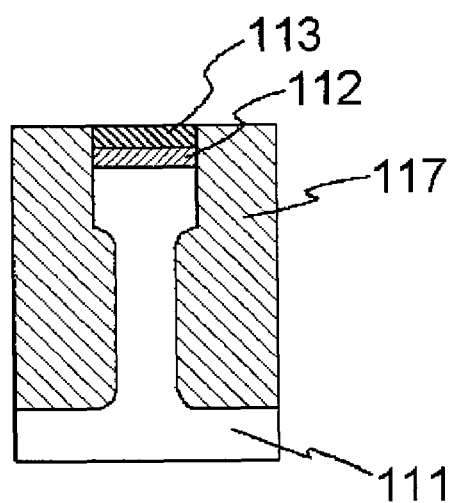
Figure 10B:
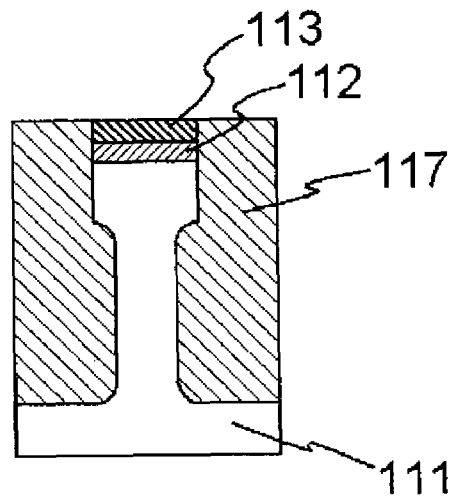
Figure 10C:
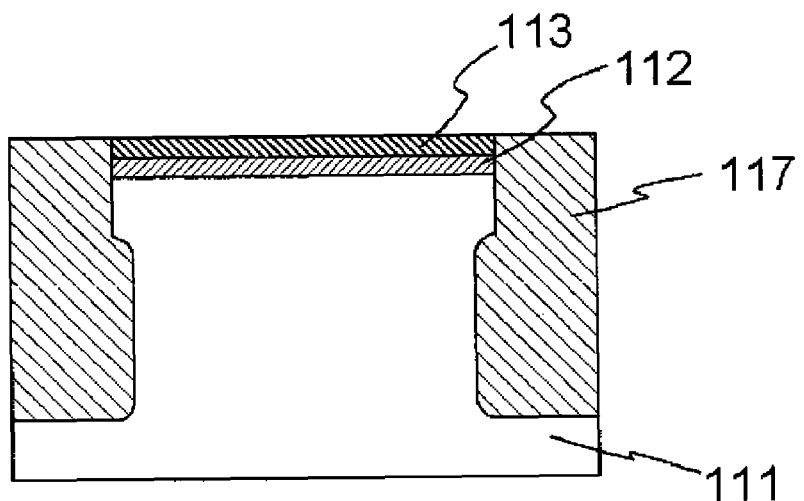

Subsequently, as shown in FIG. 10, a silicon oxide precursor film is applied with a thickness of 100 nm and, then, is subject to a thermal treatment at 800° C. for 30 minutes to convert a silicon oxide film, and, then, a silicon oxide film is deposited with a thickness of 400 nm on the entire surface of the silicon substrate by a conventional HDP-CVD (High Density Plasma-Chemical Vapor Deposition) method. Thereafter, the deposited oxide film is ground and removed by CMP method using silicon nitride film 113 as a stopper to form embedded silicon oxide film 117.

As shown in FIG. 11, silicon nitride film 113 is removed using hot phosphoric acid.

Figure 12A:
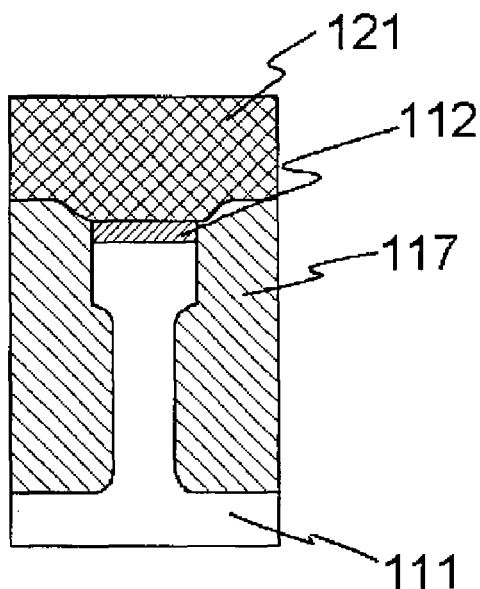
Figure 12B:
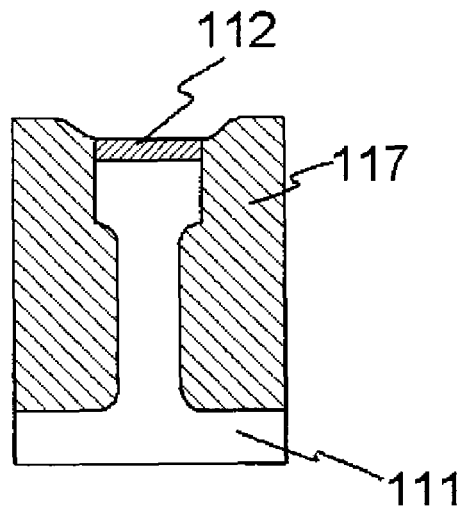
Figure 12C:
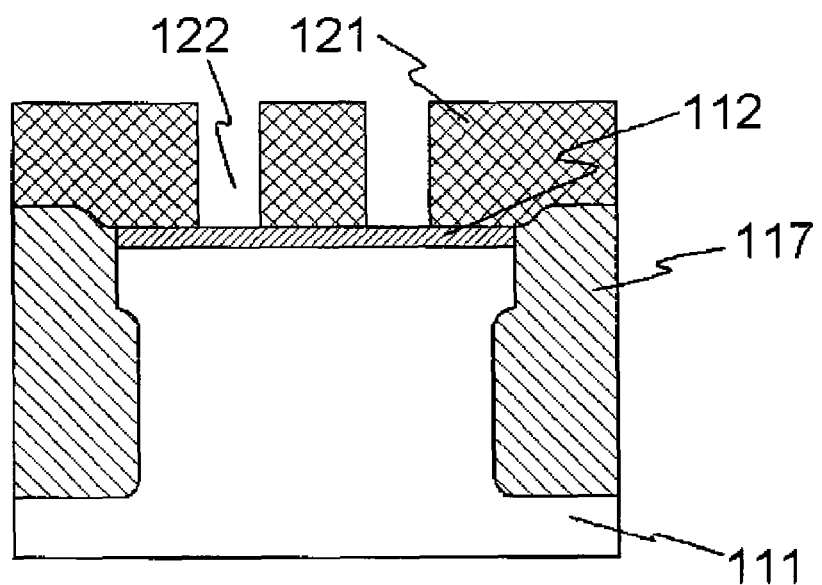
Figure 13:
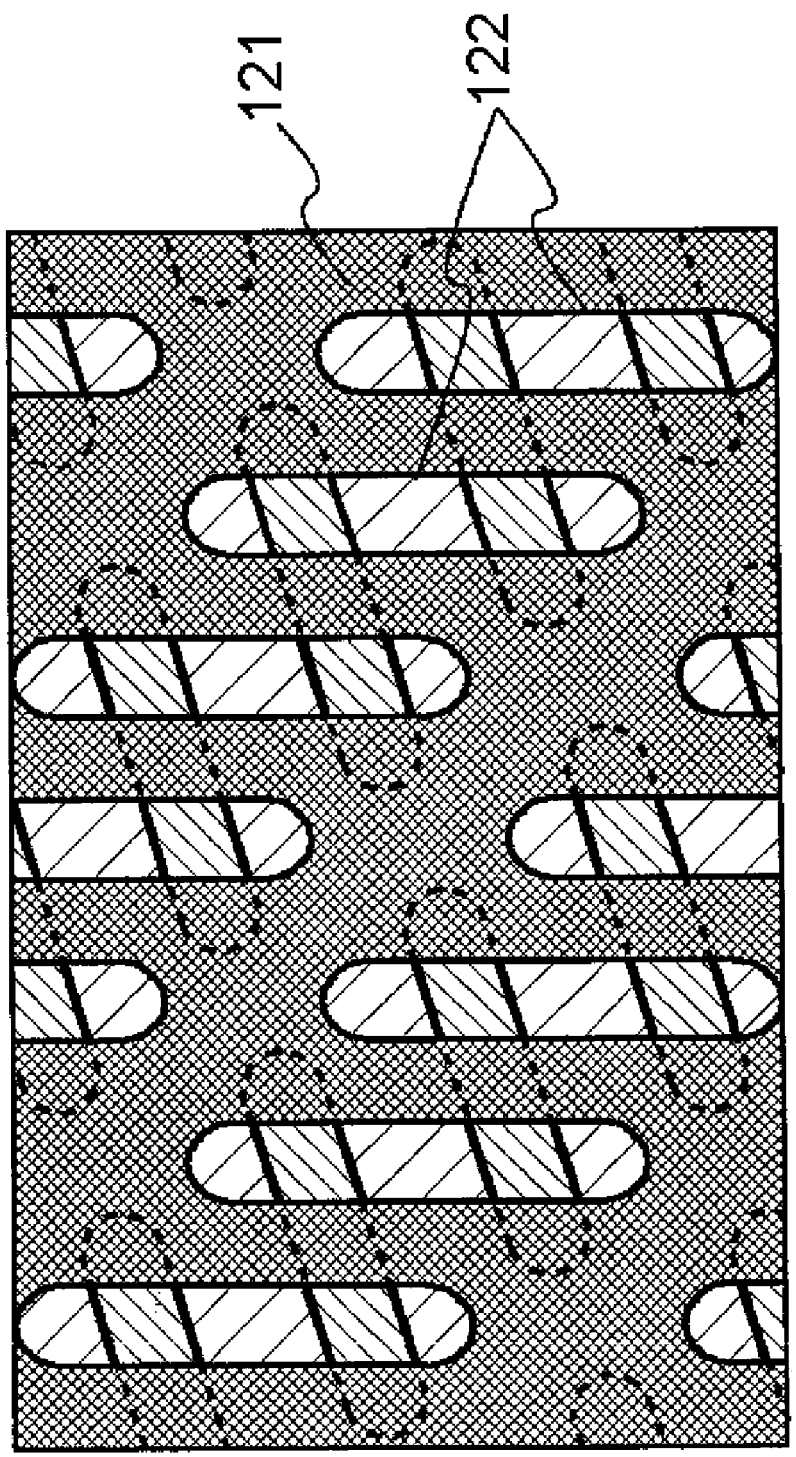
FIG. 13 is a top view showing an example of a slit pattern in the process of FIG. 12.

As shown in FIG. 12, in order to form trench gates, photoresist 121 is patterned using a conventional lithography technique so as to form slit-type openings 122. At this time, the photoresist pattern having slit-type openings 122 is formed, for example, as shown in a top view of FIG. 13. In the meanwhile, as will be described later, photoresist 121 may be patterned into a line-type so as to form continuous openings.

Figure 14A:
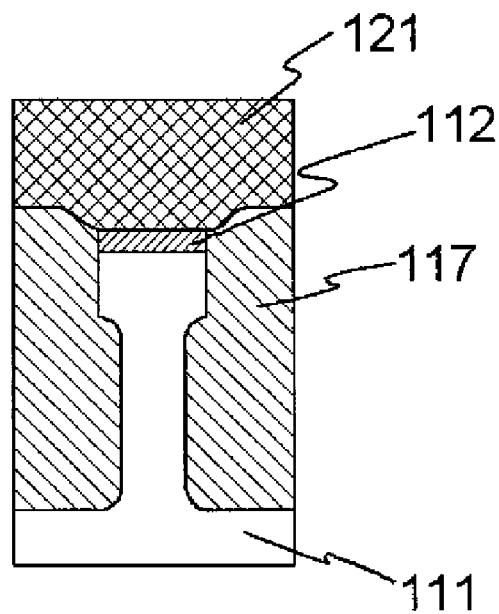
Figure 14B:
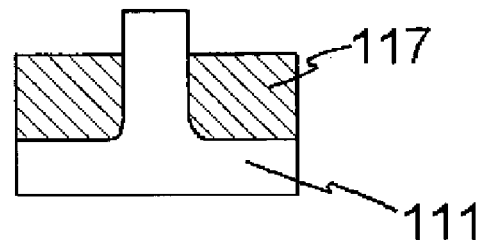
Figure 14C:
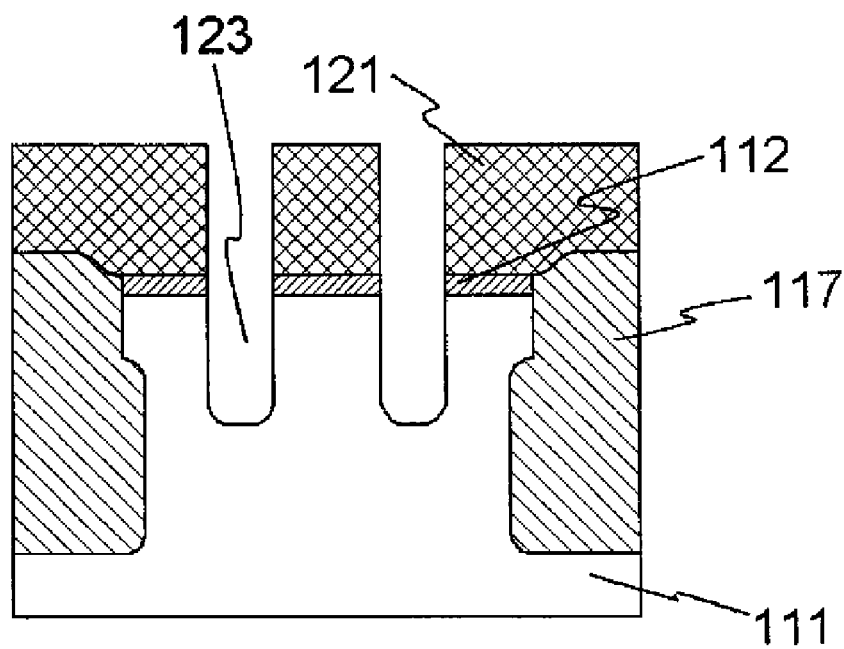

Thereafter, as shown in FIG. 14, silicon substrate 111 and embedded silicon oxide film 117 are etched away by depths of 140 nm and 190 nm, respectively by a conventional anisotropic etching method using gas in which $H_2$ gas is added into mixed gas of $CF_4$ and Ar.

As shown in FIG. 15, gate insulating film 125 is grown with a thickness of 6 nm by performing ISSG (In Situ Steam Generation) oxidation. Next, polysilicon 126 into which phosphor is doped with $1 \times 10^{20}/cm^3$ of a doping concentration is formed with a thickness of 80 nm, and, then, W/WN film 127 is formed in which tungsten film W having a thickness of 70 nm is stacked on tungsten nitride (WN) film having a thickness of 5 nm. Silicon nitride film 128 is deposited with a thickness of 140 nm by a conventional LP-CVD (Low Pressure CVD) method. Although silicon oxide film 112 remains in FIG. 15, silicon oxide film 112 may be removed and, then, a silicon oxide film may be formed when gate insulating film 125 is formed by ISSG oxidation.

As shown in FIG. 16, silicon nitride film 128 is patterned using a well-known lithography and dry etching techniques. Next, gate electrode 129 consisted of W/WN film 127 and polysilicon 126 is formed by performing an anisotropic dry etching using silicon nitride film 128 as a mask.

As shown in FIG. 17, silicon nitride film 131 is deposited with a thickness of 10 nm by LP-CVD method.

Figures 18A, 18B:
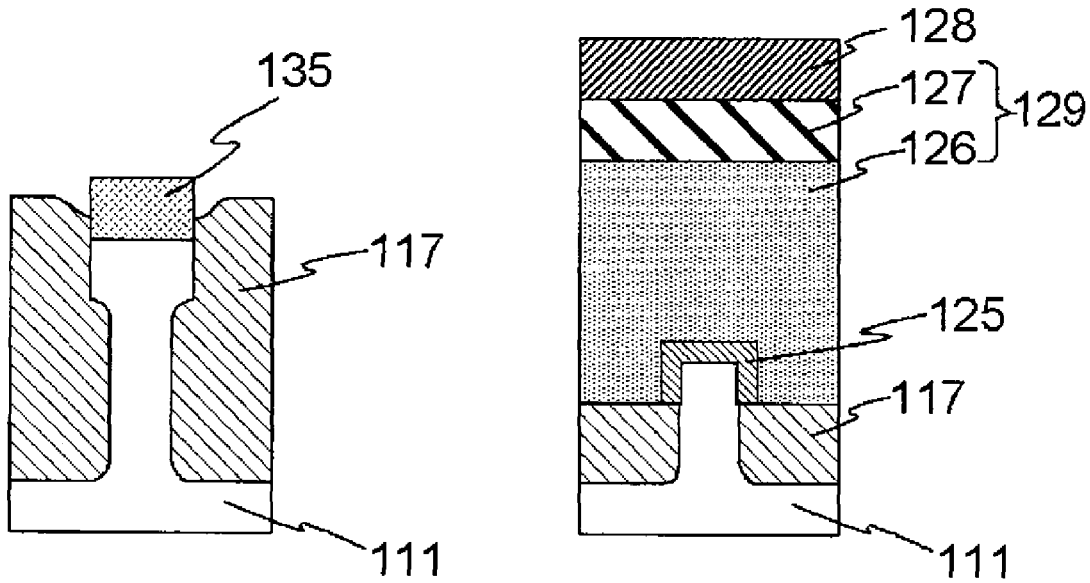
Figure 18C:
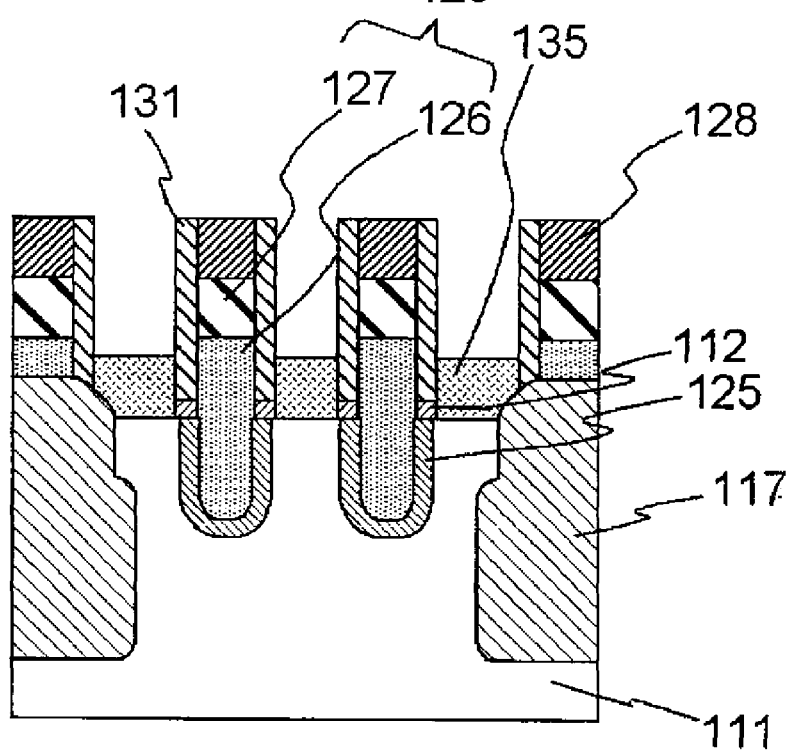

As shown in FIG. 18, silicon nitride film 131 is etched back by a conventional anisotropic dry etching and, thereafter, gate insulating film 125 on silicon substrate 111 is removed using hydrofluoric acid solution. Next, silicon 135 is grown with a thickness of 50 nm on silicon substrate 111 by a conventional selective epitaxial growth method. Although a width of silicon 135 is shown in FIG. 18 so that the width is equal to a width of the active region, the width of silicon 135 may be larger than the width of the active region in a certain region in which the growth is not controlled by an insulating film, etc and, hence, silicon 135 can be grown laterally.

Figure 19A:
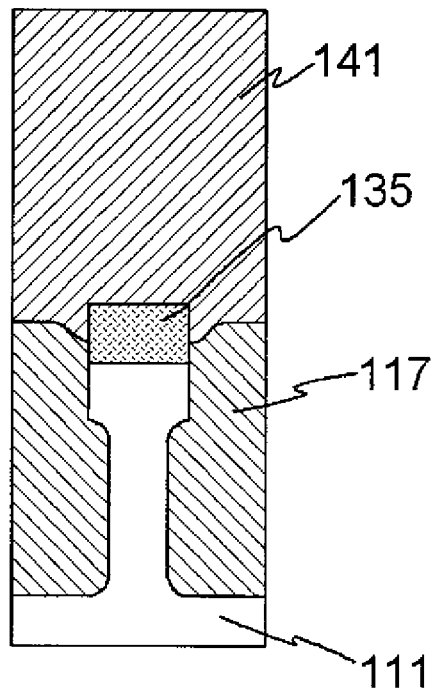
Figure 19B:
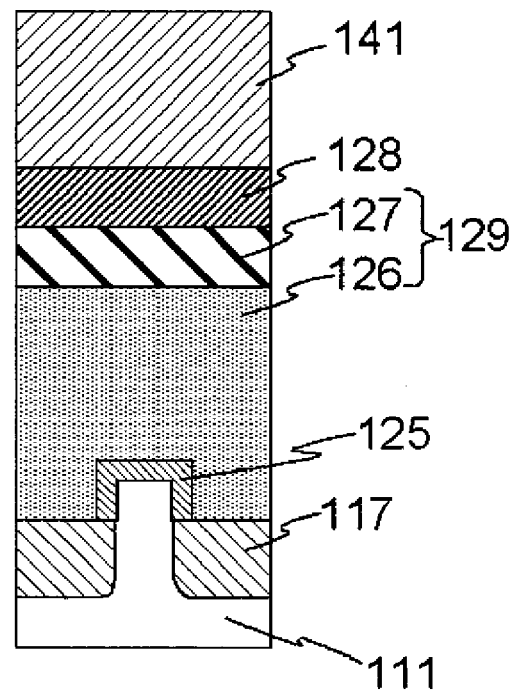
Figure 19C:
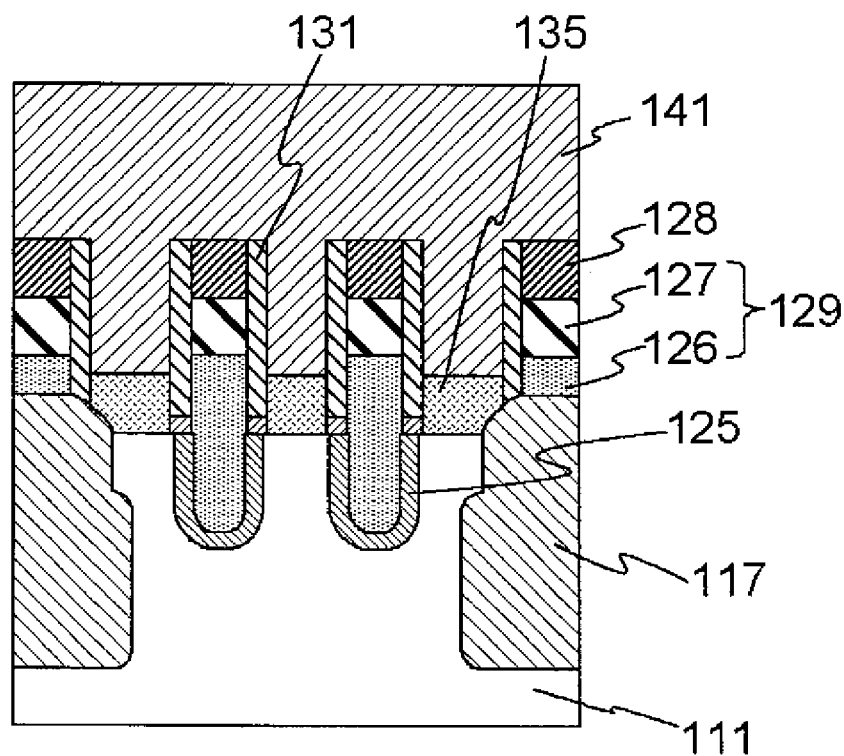

Next, as shown in FIG. 19, BPSG (Boro-Phospho Silicate Glass) film 141 is deposited with a thickness of 400 nm as an interlayer insulating film relative insulating wires, and, then, is subject to a reflow treatment at 750° C. for 30 minutes.

Figure 20A:
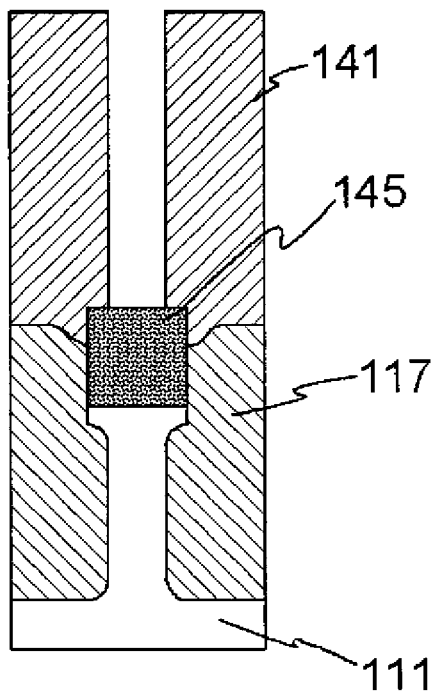
Figure 20B:
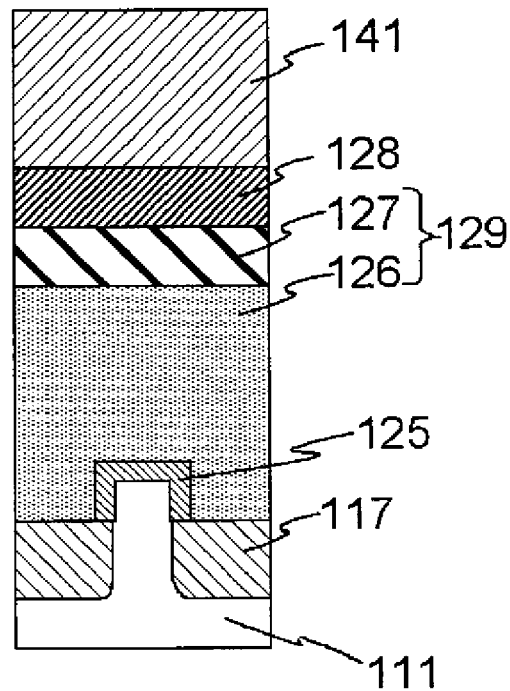
Figure 20C:
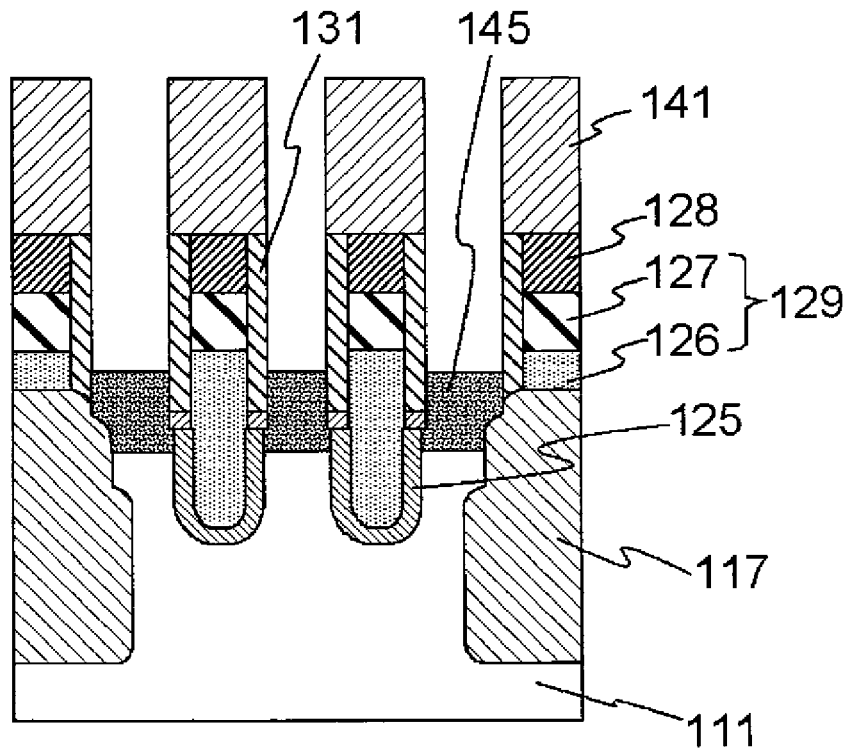

As shown in FIG. 20, contact holes are formed by a well-known lithography and dry etching techniques. Thereafter, source and drain diffusion layers 145 are formed by ion-implanting $1.0 \times 10^{13}/cm^2$ of phosphor with 20 keV of accelerating energy and performing a thermal treatment at 900° C. for 10 seconds.

Figure 21A:
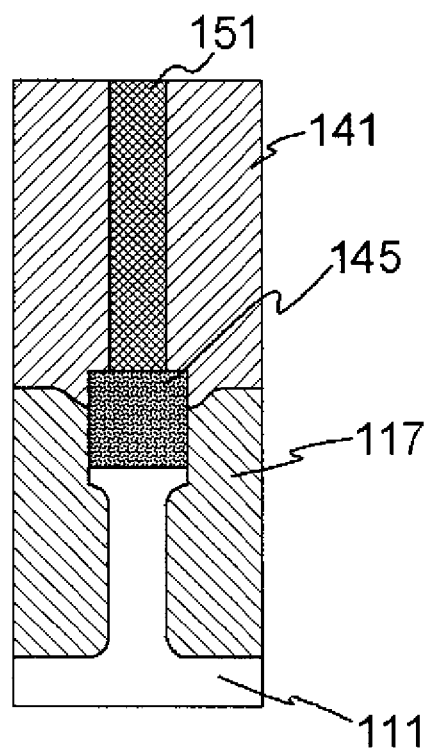
Figure 21B:
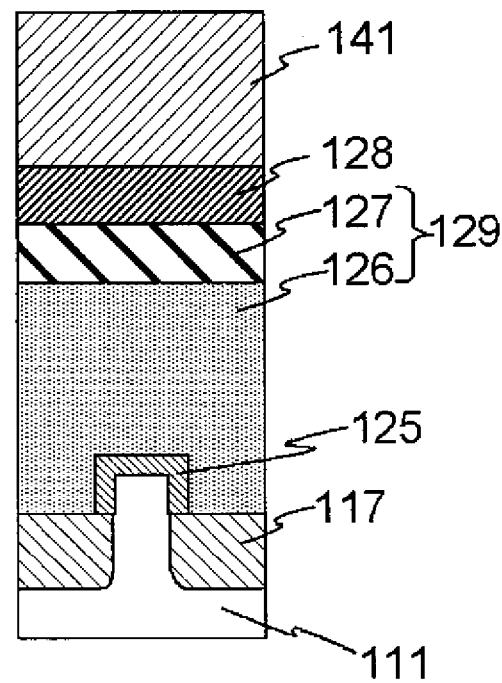
Figure 21C:
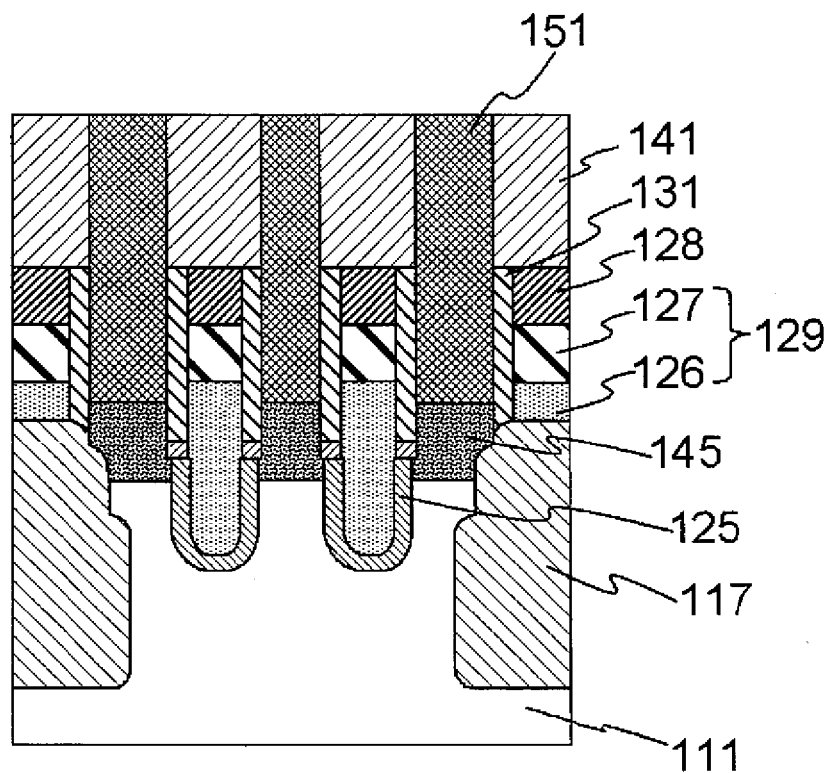

As shown in FIG. 21, polysilicon into which phosphor is doped with $1 \times 10^{20}/cm^3$ of a doping concentration is deposited with a thickness of 80 nm by LP-CVD method, and, then, the deposited polysilicon is ground and removed by CMP (Chemical Mechanical Polishing) method to form polysilicon plugs 151.

In the resultant Trench-Gate Fin-FET, as shown in FIG. 22, fin width 162 ($T_{fin}$) becomes smaller than width 161 (W) of the active region. Reduced quantity (Vth roll-off) ΔVth of threshold voltage Vth due to the short channel effect in Fin-FET is calculated as following:

$$\Delta Vth = -\frac{32}{\pi^2} \frac{S \cdot q}{2.3kT} \exp\left(-\frac{L_{eff}}{2L_d}\pi\right) \cdot \left[\sqrt{\phi_{ms}(\phi_{mx} - V_{ds})} - |\phi_{ms}|\right]$$

Here, S represents a sub-threshold coefficient, q represents quantity of electronic charges, k represents Boltzmann constant, T represents absolute temperature, $L_{eff}$ represents an effective channel length, $L_d$ represents a decay length of a drain potential, $\phi_{ms}$, represents a difference between work functions of the gate electrode and the semiconductor substrate, and $V_{ds}$ represents a drain voltage.

$L_d$ is represented as a function of an effective fin width ($T_{eff}$) and an effective fin height ($H_{eff}$) as follows:

$$L_d = \frac{1}{\sqrt{\left(\frac{1}{T_{eff}}\right)^2 + \left(\frac{0.5}{H_{eff}}\right)^2}}$$

Here, provided that a thickness of the gate insulating film (silicon oxide film) is represented as $T_{ox}$ and dielectric constant of silicon and the oxide film as $\in_{si}$ and $\in_{ox}$, respectively, so that $T_{eff}$ and $H_{eff}$ are represented as follows:

$$T_{eff} = T_{fin} + \frac{2\varepsilon_{si}}{\varepsilon_{ox}}T_{ox}, \quad H_{eff} = H_{fin} + \frac{\varepsilon_{si}}{\varepsilon_{ox}}T_{ox}$$

Figure 23:
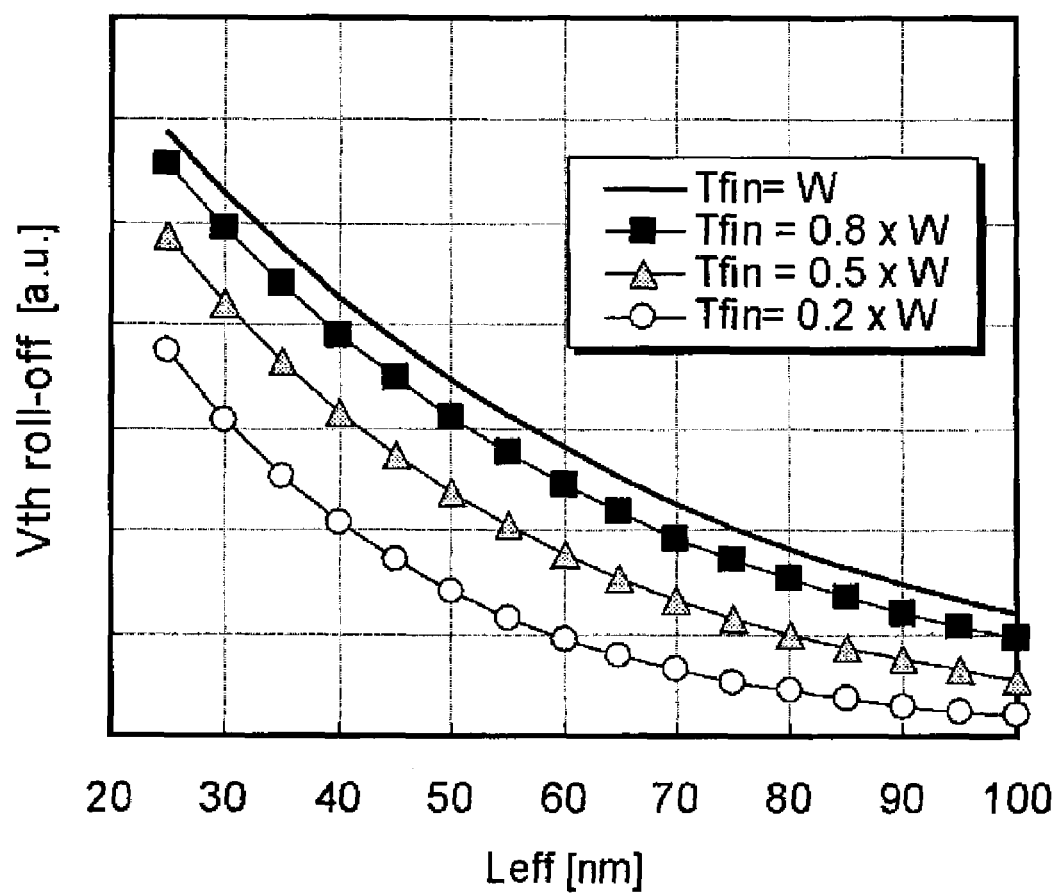
FIG. 23 is a graph illustrating dependency of reduced quantity of threshold voltage on an effective channel length.

FIG. 23 illustrates dependency of reduced quantity of the threshold voltage on the effective channel length when fin height 163 ($H_{fin}$) in FIG. 22 is 50 nm. The reduced quantity of the threshold voltage become smaller by employing $T_{fin}<W$ (width of the active region) according to the present invention rather than $T_{fin}=W$ according to prior art. This becomes more outstanding in particular when $T_{fin} \leq 0.5 \times W$. Further, a minimum of $T_{fin}$ may be reduced to the extent that the third Fin structure is not collapsed in the manufacturing process and, at the same time, can be securely fabricated.

Figure 24:
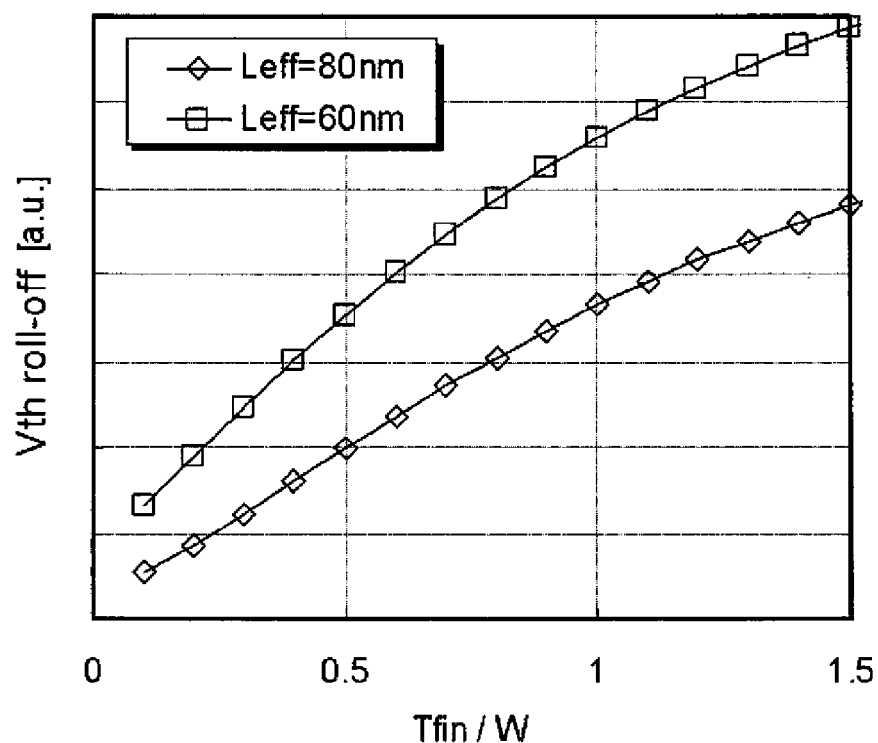
FIG. 24 is a graph illustrating dependency of reduced quantity of threshold voltage on a ratio of $T_{fin}/W$.

FIG. 24 illustrates dependency of reduced quantity of the threshold voltage on a ratio of $T_{fin}/W$ when the fin height $H_{fin}$ and the width of the active region in FIG. 22 are 50 nm and 60 nm, respectively. The reduced quantity of the threshold voltage increases by shrinking $L_{eff}$ from 80 nm to 60 nm when the conventional ratio of $T_{fin}/W=1$ is kept up as it is. On the other hand, $L_{eff}$ can be shrunken to 60 nm without increasing the reduced quantity by changing the ratio to $T_{fin}/W=0.5$, in the present invention.

Figure 25:
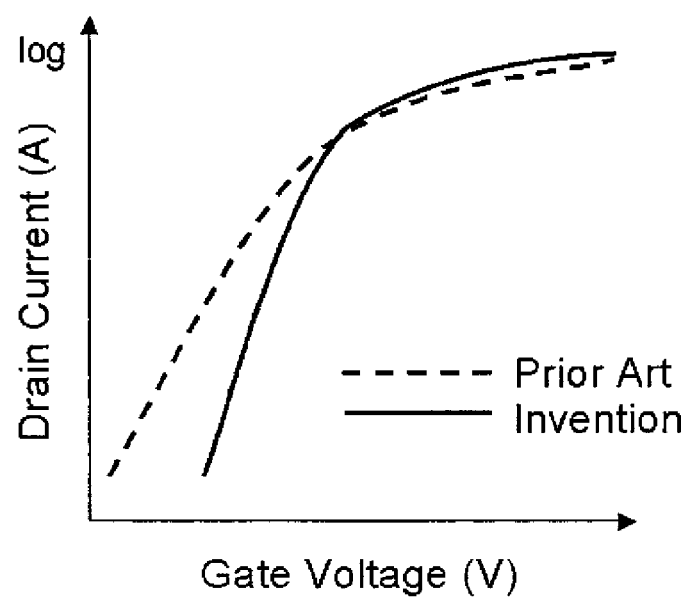
FIG. 25 is a graph illustrating dependency of a drain current on a gate voltage.
Figure 26A:
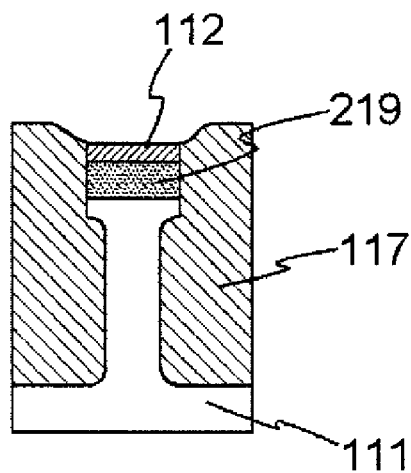
FIG. 26 to FIG. 27 and FIG. 29 to FIG. 38 are cross-sectional views of processes showing manufacturing processes according to a second exemplary embodiment of the present invention; and in which figures (a), (b), (c), and (d) correspond to cross-sections taken in lines A-A', B-B', C-C' and D-D' of FIG. 1 respectively.
Figure 26B:
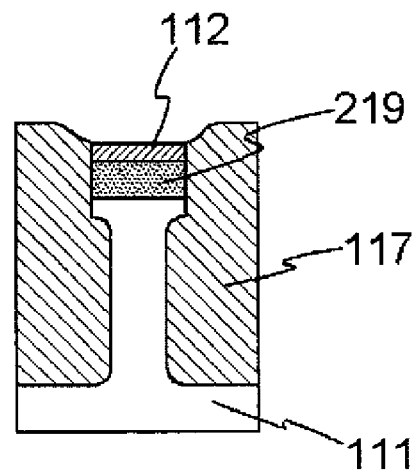
Figure 26C:
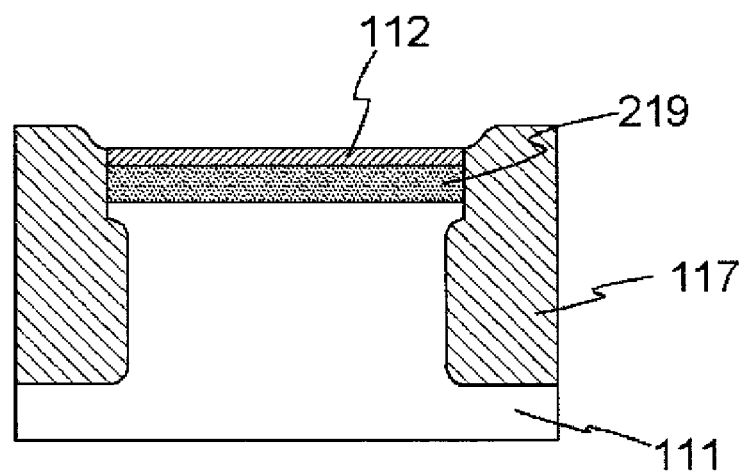
Figure 26D:
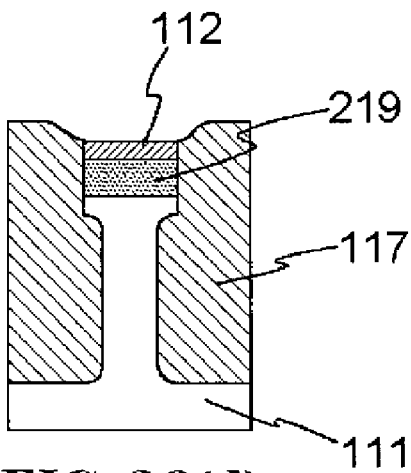
Figure 27A:
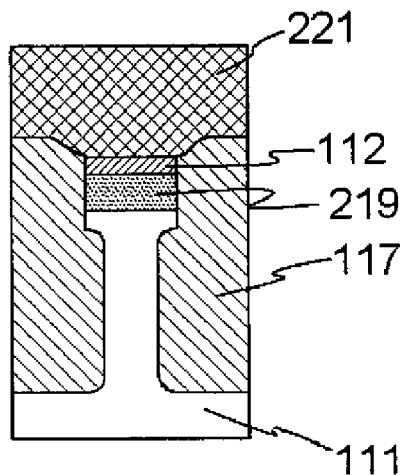
Figure 27B:
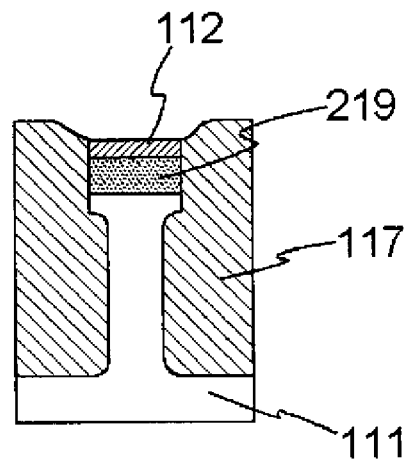
Figure 27C:
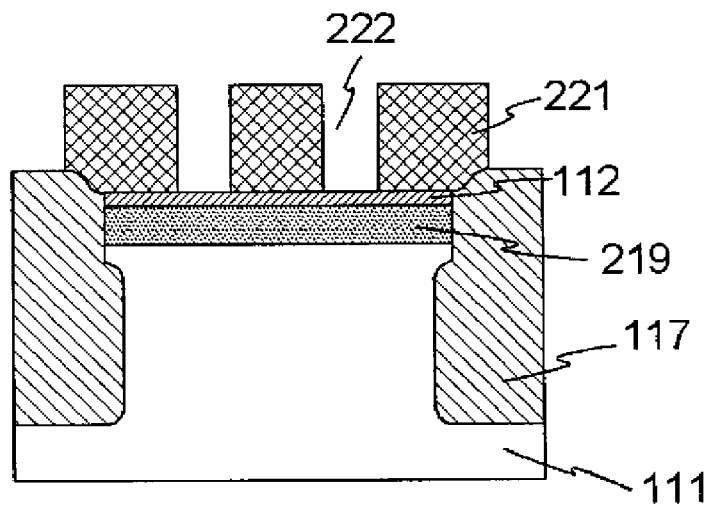
Figure 27D:
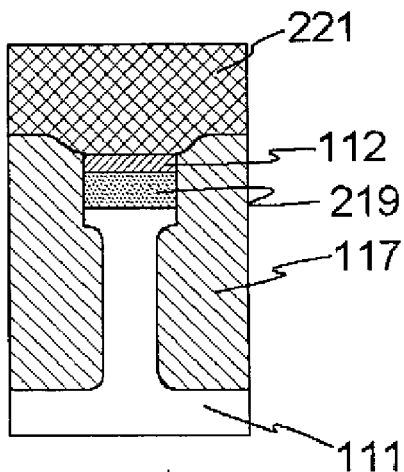

FIG. 25 illustrates dependency of the drain current on a gate voltage when the present invention is applied to the Trench-Gate Fin-FET formed at the same process generation. The short channel effect can be suppressed in the present invention while it is not the conventional case, i.e., $T_{fin}=W$, so that the characteristic of a sub-threshold voltage improves in the present invention.

Second Exemplary Embodiment

In a second exemplary embodiment, a semiconductor device as Embedded-Gate Fin-FET having an embedded gate which is one kind of the trench gate is set forth in which the width of the active region is 60 nm and the width of the channel region is 30 nm.

In the second exemplary embodiment, an example in which the Embedded-Gate Fin-FET is used as a memory cell transistor of DRAM is described referring to the drawings. Firstly, in the same way as the first exemplary embodiment, the processes as shown in FIG. 2 to FIG. 10 are executed. In the meanwhile, silicon substrate 111 is etched away by a depth of 100 nm in FIG. 4 as in the first exemplary embodiment and, further, silicon substrate 111 is etched away by a depth larger than a depth of source and drain diffusion layers to be connected to a capacitor of the DRAM.

Thereafter, as shown in FIG. 26, silicon nitride film 113 is removed using hot phosphoric acid. Next, source and drain diffusion layers 219 are formed with a junction depth of 80 nm by ion-implanting $1.0\times10^{13}/cm^2$ of phosphor with 15 keV of accelerating energy and, in addition, ion-implanting $2.0\times10^{13}/cm^2$ of arsenic with 15 keV of accelerating energy and, then, performing a thermal treatment at 950° C. for 10 seconds.

Figure 28:
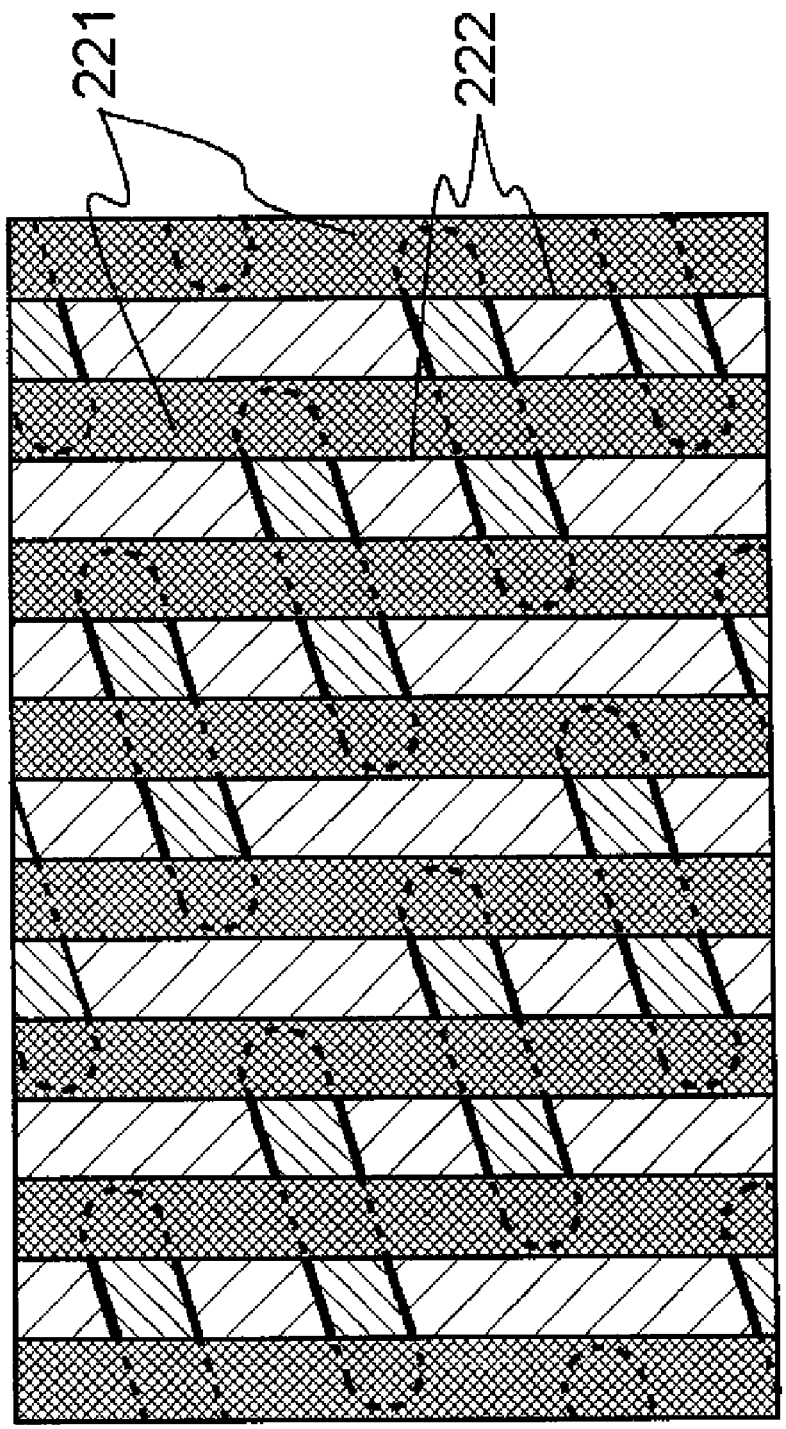
FIG. 28 is a top view in the process of FIG. 27.
Figure 29A:
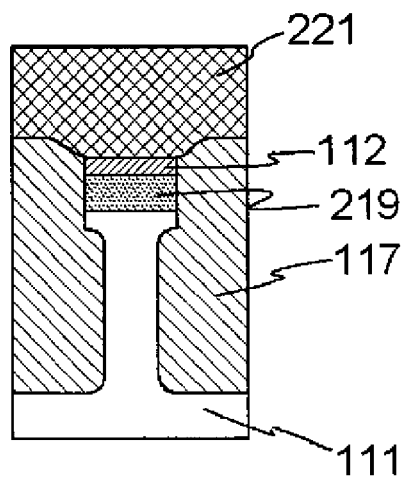
Figure 29B:
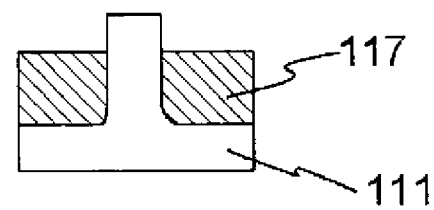
Figure 29C:
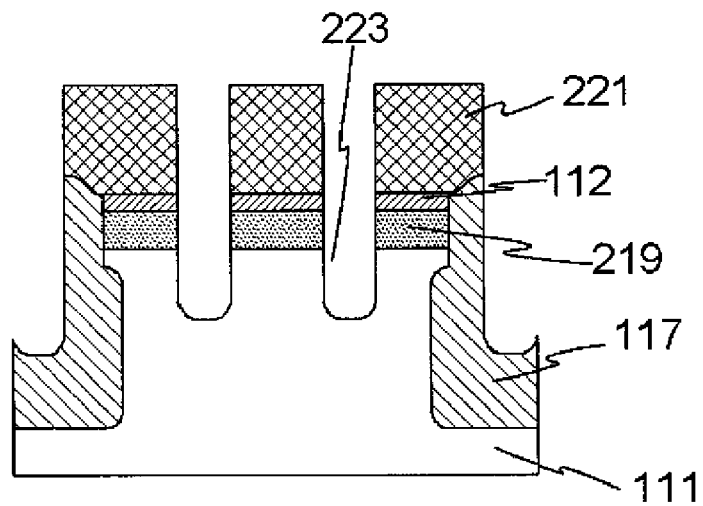
Figure 29D:
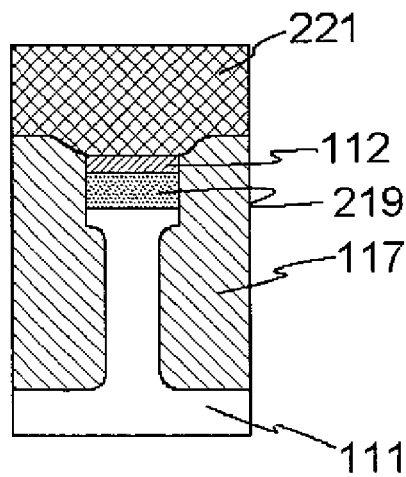
Figure 30A:
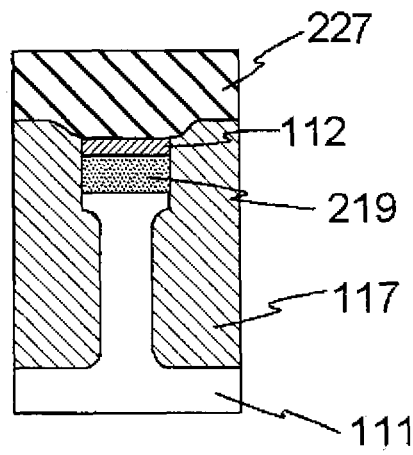
Figure 30B:
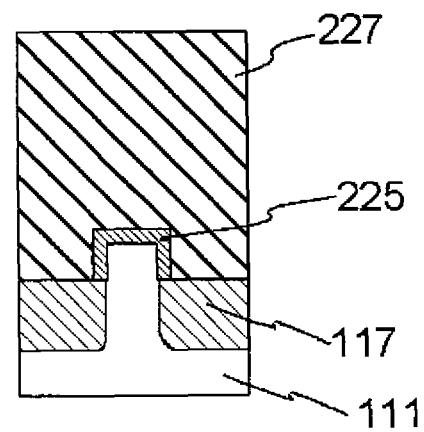
Figure 30C:
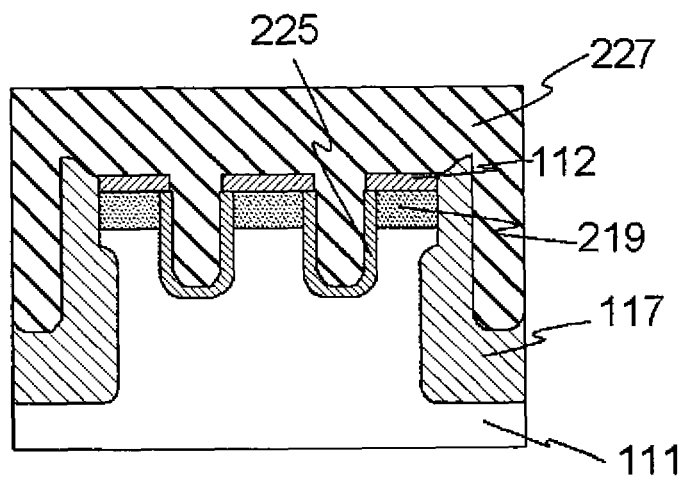
Figure 30D:
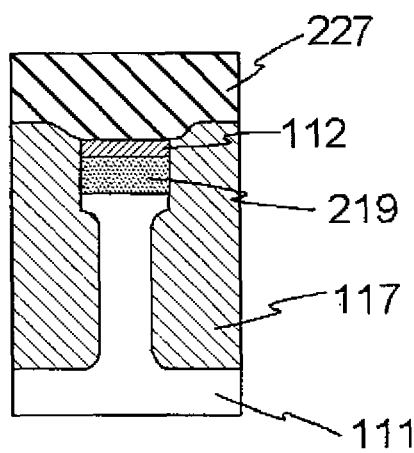
Figure 31A:
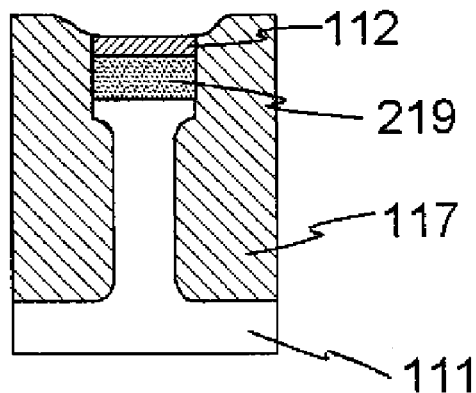
Figure 31B:
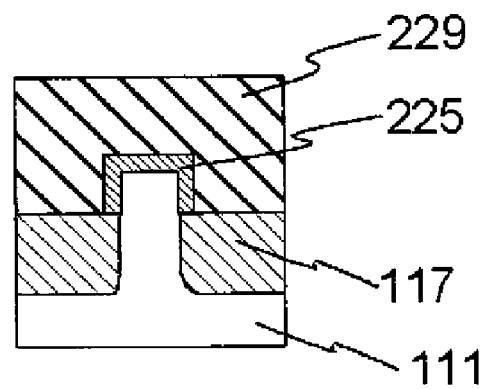
Figure 31C:
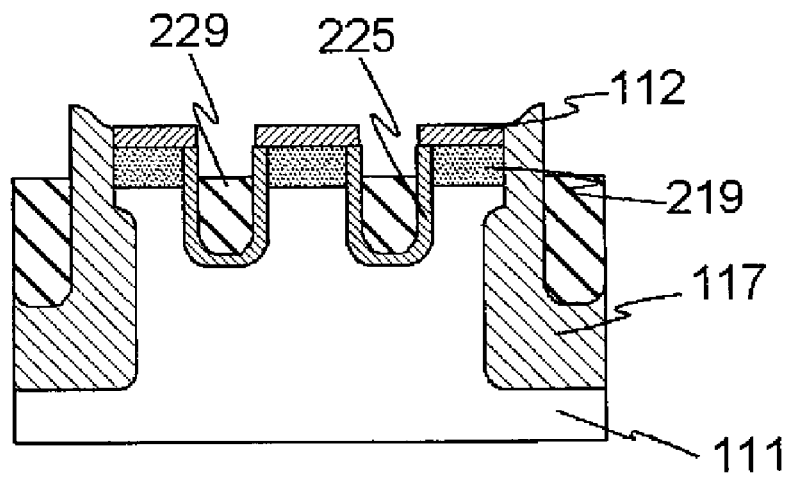
Figure 31D:
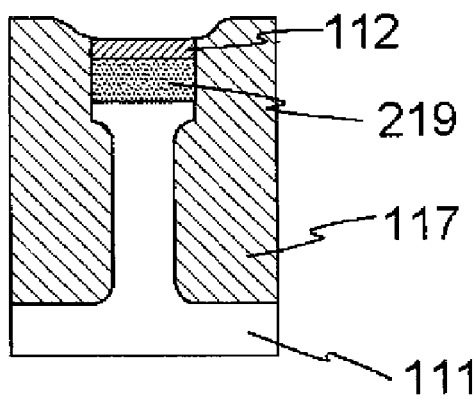
Figure 32A:
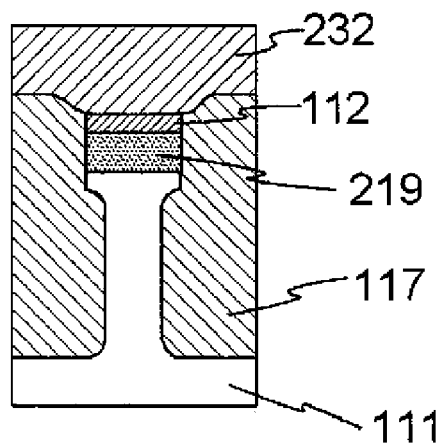
Figure 32B:
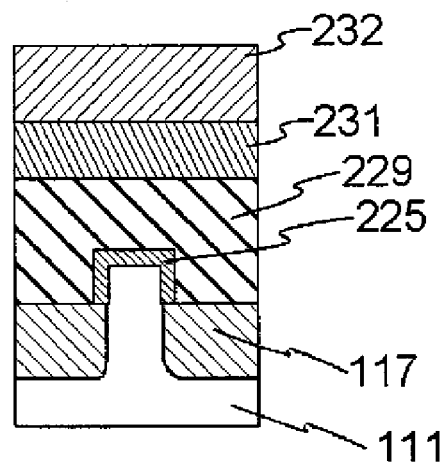
Figure 32C:
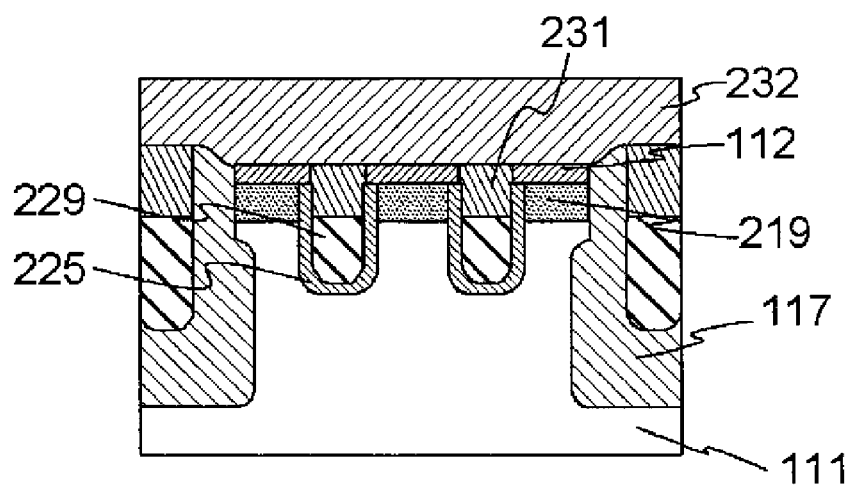
Figure 32D:
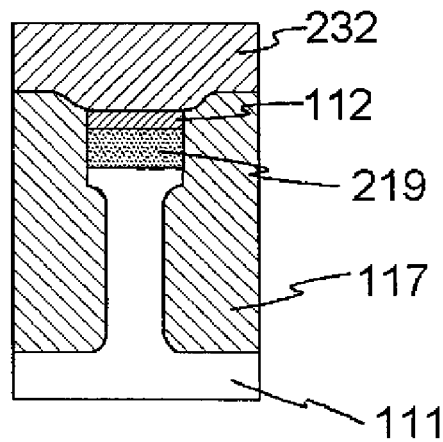
Figure 33A:
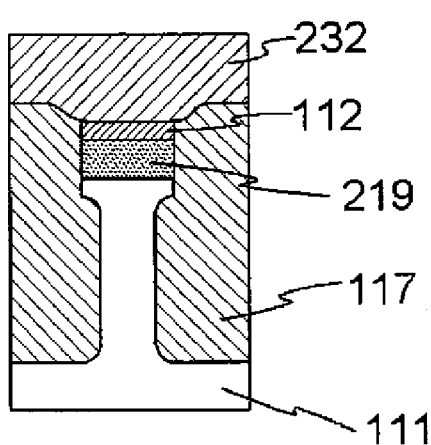
Figure 33B:
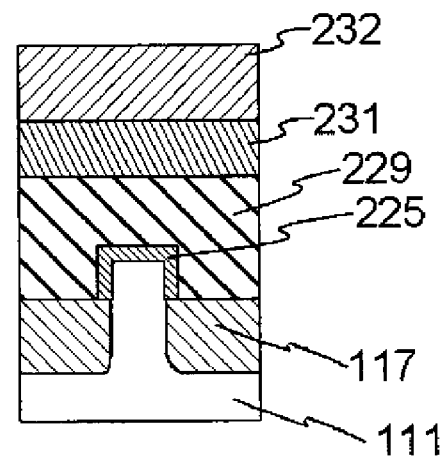
Figure 33C:
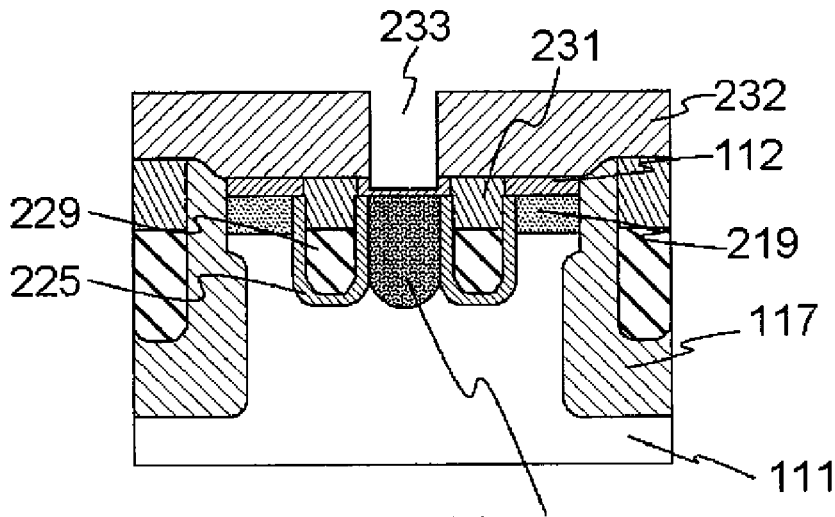
Figure 33D:
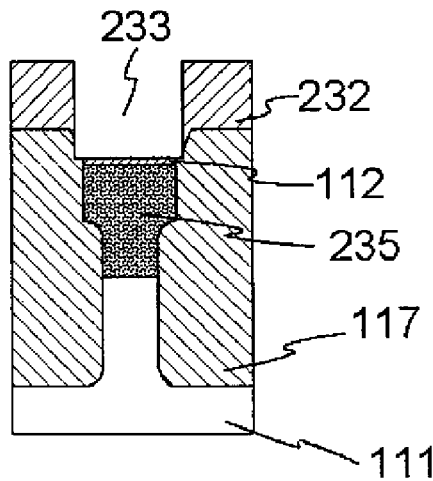
Figure 34A:
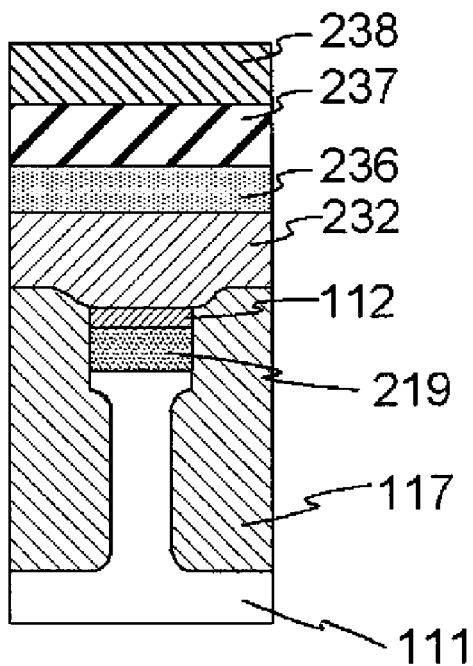
Figure 34B:
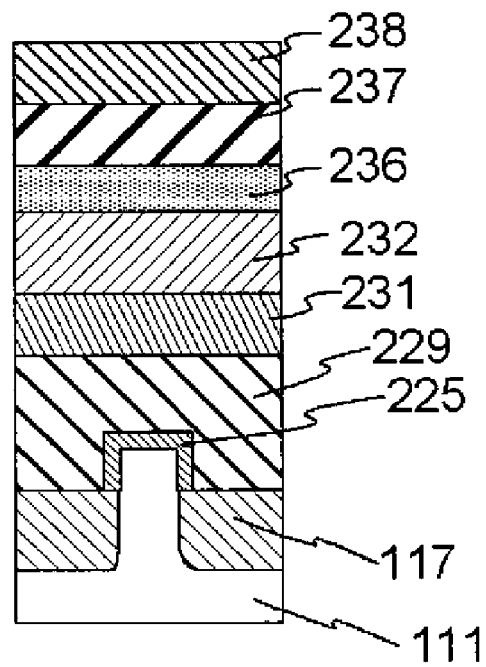
Figure 34C:
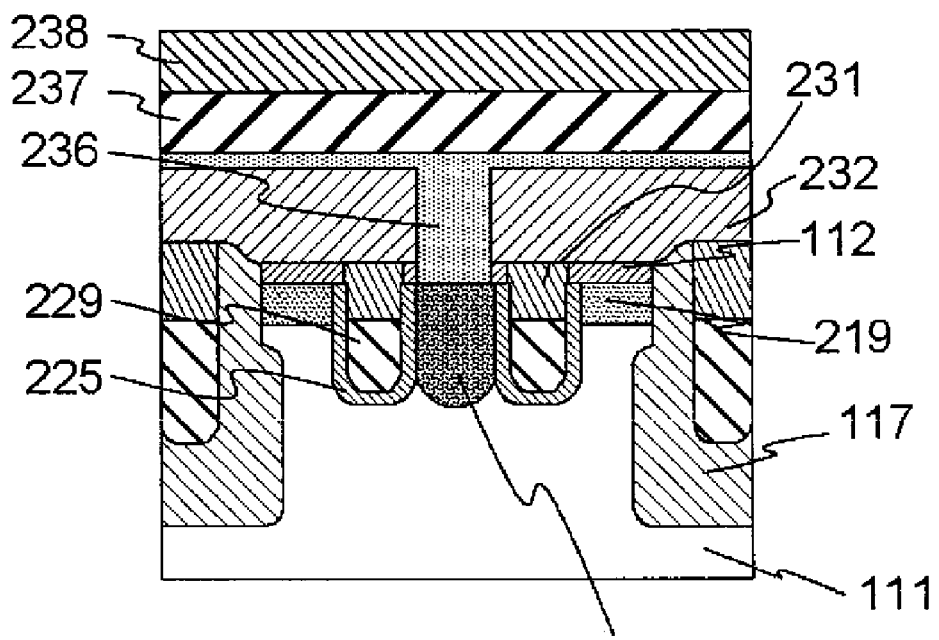
Figure 34D:
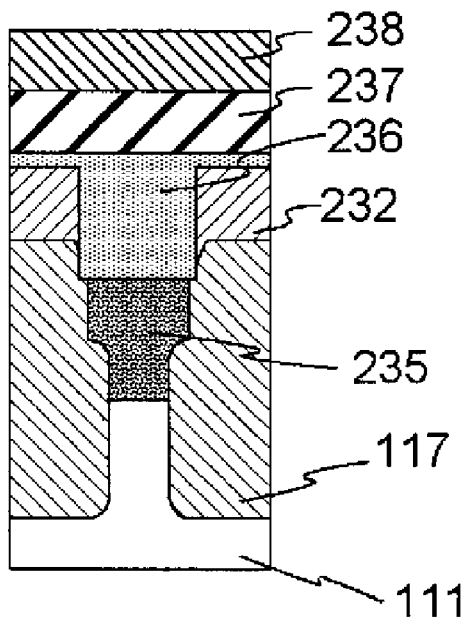
Figure 35A:
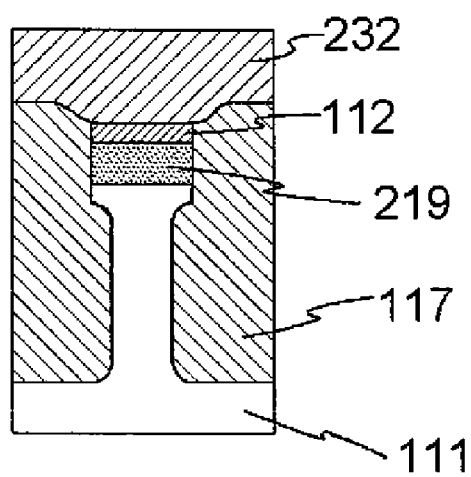
Figure 35B:
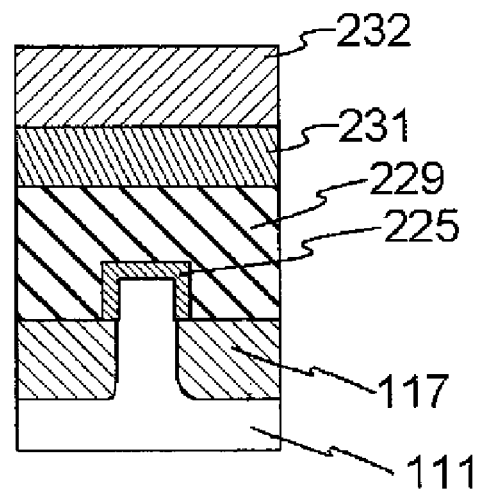
Figure 35C:
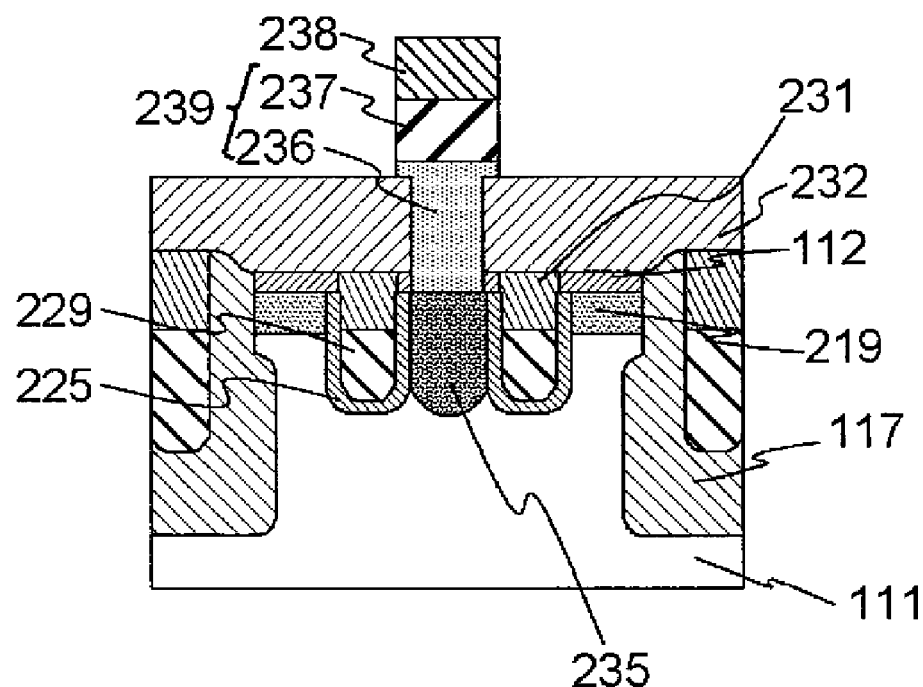
Figure 35D:
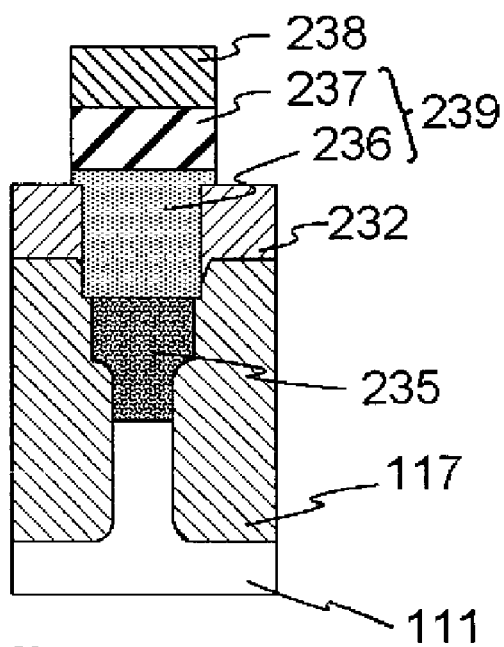

As shown in FIG. 27, in order to form embedded gates, photoresist 221 is patterned using a conventional lithography technique so as to form line-type openings 222. At this time, the photoresist pattern having line-type openings 222 is formed, for example, as shown in a top view of FIG. 28.

Thereafter, as shown in FIG. 29, silicon substrate 111 and embedded oxide film 117 are etched away by depths of 140 nm and 190 nm respectively by a conventional anisotropic etching method using gas in which $H_2$ gas is added into mixed gas of $CF_4$ and Ar, so that trenches 223 are formed.

As shown in FIG. 30, gate insulating film 225 is grown with a thickness of 4 nm by performing ISSG (In Situ Steam Generation) oxidation. Next, W/TiN film 227 is formed in which a tungsten (W) film having a thickness of 80 nm is stacked on a titanium nitride (TiN) film having a thickness of 5 nm.

As shown in FIG. 31, W/TiN film 227 is etched back by a conventional dry etching so that W/TiN film 227 remains with a thickness of 80 nm on the gate insulating film 225, thereby resulting in forming embedded gate electrode 229.

As shown in FIG. 32, an insulating film 231 is embedded on the gate electrode by applying it on the gate electrode and, then, silicon oxide film 232 is deposited with a thickness of 150 nm by conventional plasma CVD.

As shown in FIG. 33, opening 233 being contact hole with a bit line of DRAM is formed by a well-known lithography and dry etching techniques. At this time, silicon oxide films 232, 112 are etched away so that a little of silicon oxide film 112 remains in the bottom of opening 233. Subsequently, source and drain diffusion layers 235 to be connected to a bit line are formed by ion-implanting $10\times10^{15}/cm^2$ of phosphor with 15 keV of accelerating energy and, then, performing a thermal treatment at 950° C. for 10 seconds.

As shown in FIG. 34, silicon oxide film 112 remaining in the bottom of opening 233 is removed by a conventional wet-etching method to complete a contact hole and, next, polysilicon 236 into which phosphor is doped with $1\times10^{20}/cm^3$ of a doping concentration is formed with a thickness of 80 nm. Then, W/WN film 237 is formed in which a tungsten (W) film having a thickness of 70 nm is stacked on a tungsten nitride (WN) film having a thickness of 5 nm. Subsequently, silicon nitride film 238 is deposited with a thickness of 140 nm by a conventional LP-CVD (Low Pressure CVD) method.

As shown in FIG. 35, silicon nitride film 238 is patterned using a well-known lithography and dry etching techniques. Subsequently, bit line 239 consisted of polysilicon 236 and W/WN film 237 is formed by performing an anisotropic dry etching using silicon nitride film 238 as a mask.

Figure 36D:
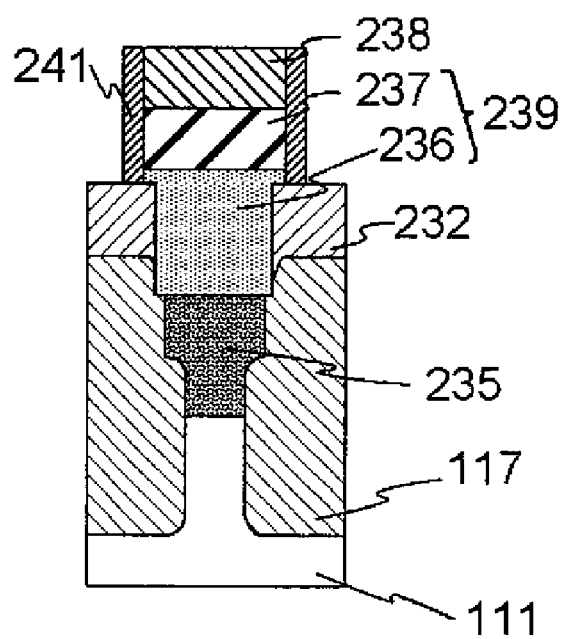
Figure 37A:
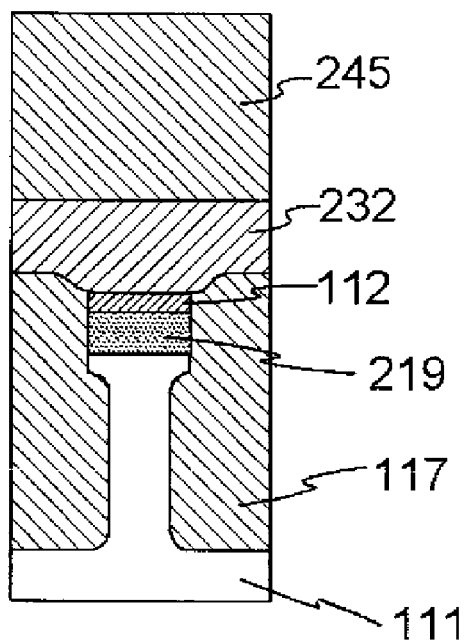
Figure 37B:
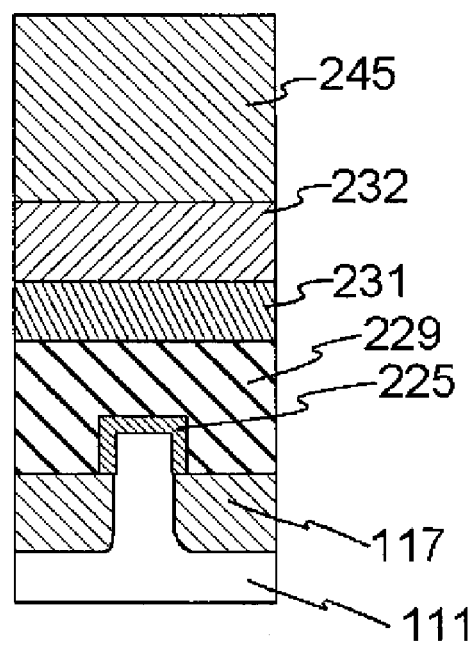
Figure 37C:
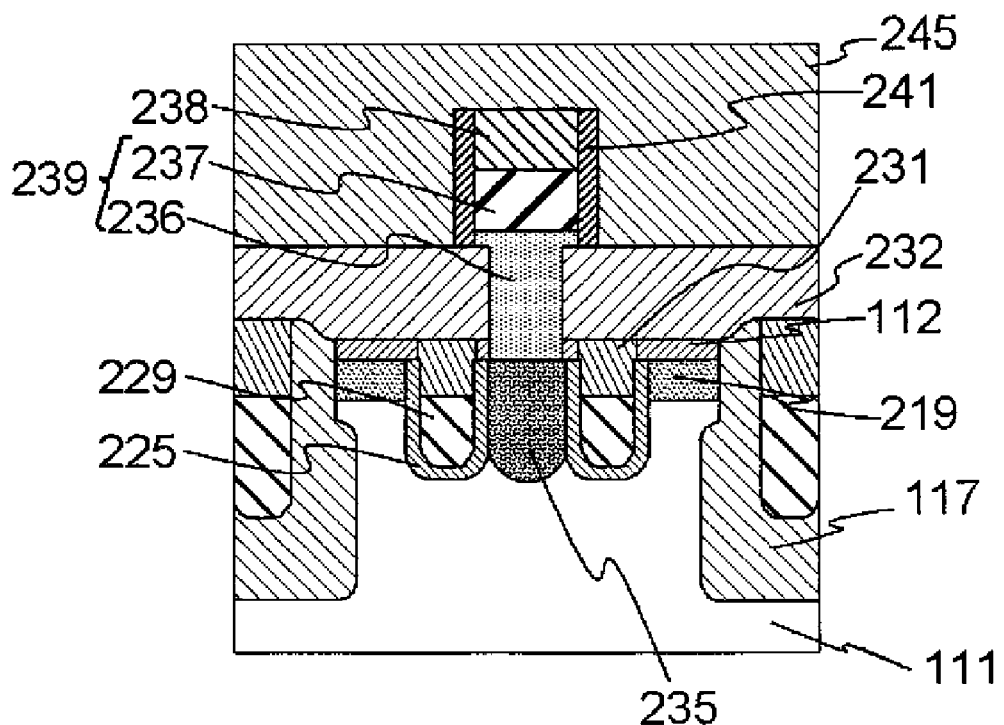
Figure 37D:
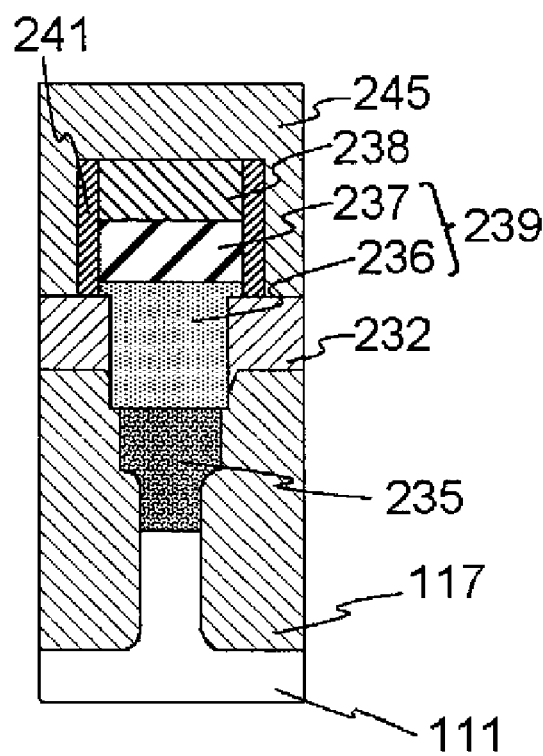
Figure 38A:
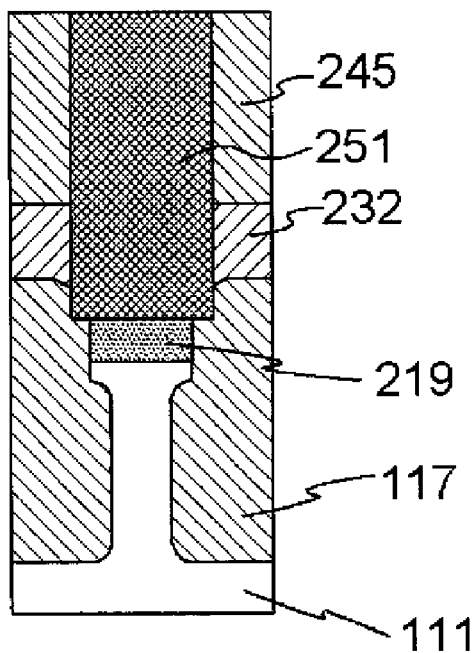
Figure 38B:
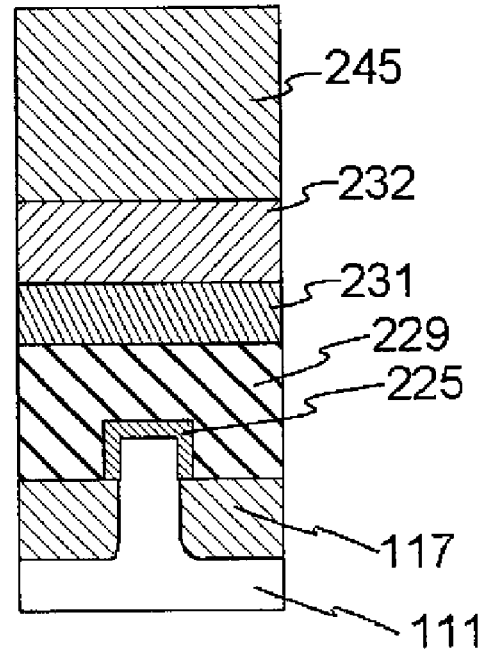
Figure 38C:
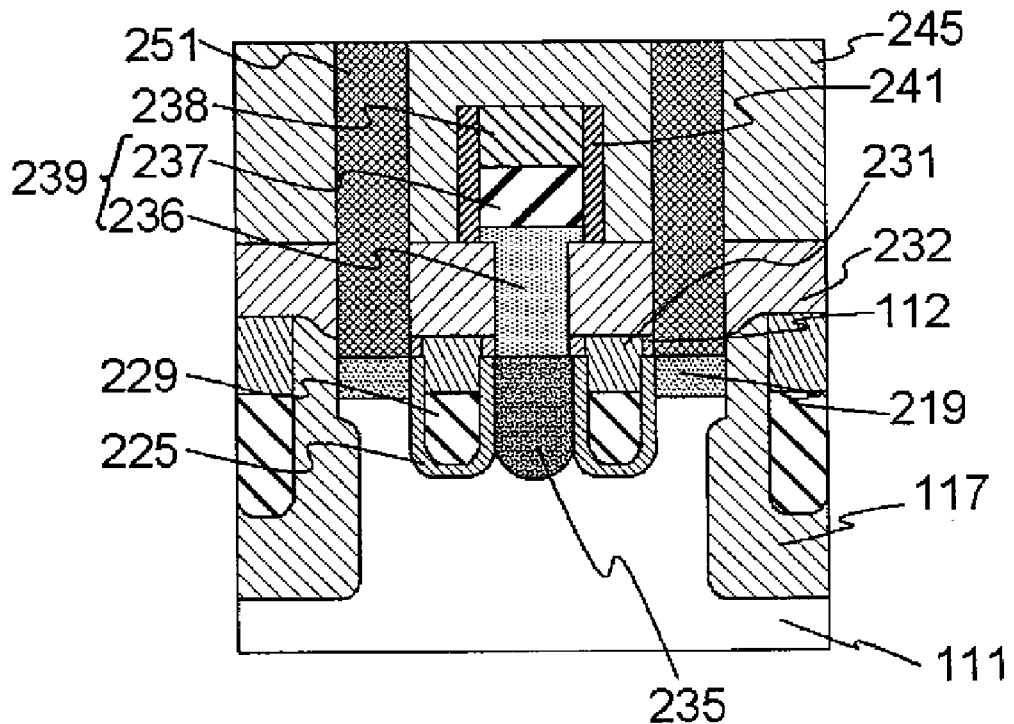
Figure 38D:
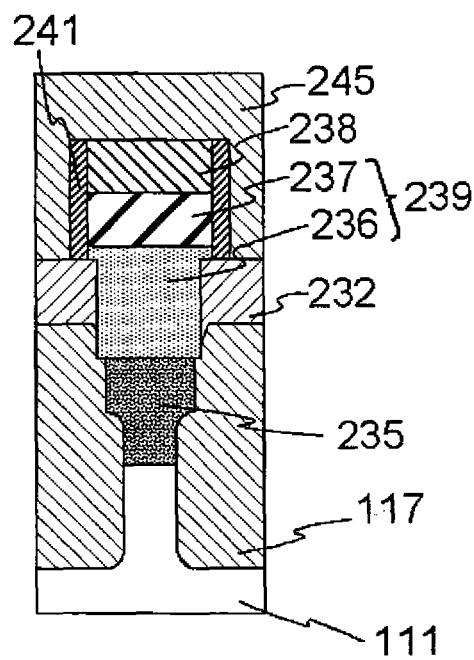

As shown in FIG. 36, a silicon nitride film is deposited with a thickness of 10 nm using LP-CVD method and, then, is etched back using a conventional dry etching method to form side wall silicon nitride films 241 on side faces of the bit line.

As shown in FIG. 37, BPSG film 245 is deposited with a thickness of 400 nm as an interlayer insulating film insulating wires using CVD method, and, then, is subject to a reflow treatment at 750° C. for 30 minutes.

As shown in FIG. 38, a contact hole is formed using a well-known lithography and dry etching techniques. Subsequently, polysilicon into which phosphor is doped with $1\times10^{20}/cm^3$ of a doping concentration is deposited with a thickness of 80 nm by LP-CVD method, and, then, the deposited polysilicon is ground and removed by CMP method to form polysilicon plug 251. Polysilicon plug 251 is connected to a capacitor which will be fabricated later.

Figure 39A:
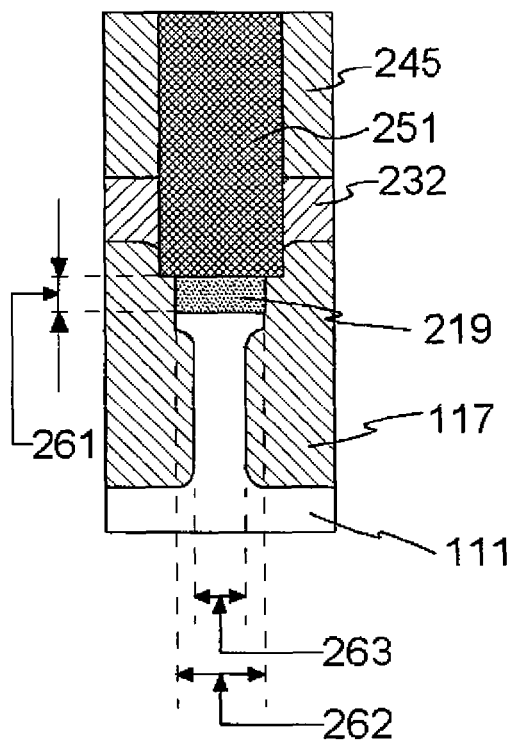
FIG. 39 is a cross-sectional view illustrating respective sizes of various portions in Fin structure according to the second exemplary embodiment; and in which figures (a) and (b) correspond to cross-sections taken in lines A-A' and B-B' of FIG. 1 respectively.
Figure 39B:
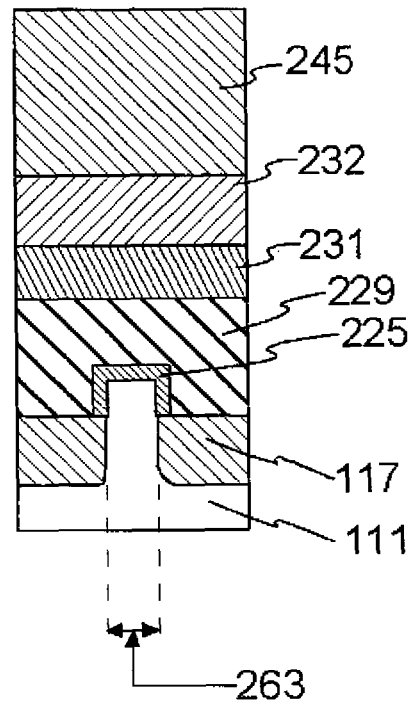

In the resultant Embedded-Gate Fin-FET, as shown in FIG. 39, a contact width 262 with polysilicon plug 251 becomes larger than fin width 263 ($T_{fin}$) and, hence, the decreasing of the on-current due to increasing of the contact resistance can be suppressed.

Figure 40:
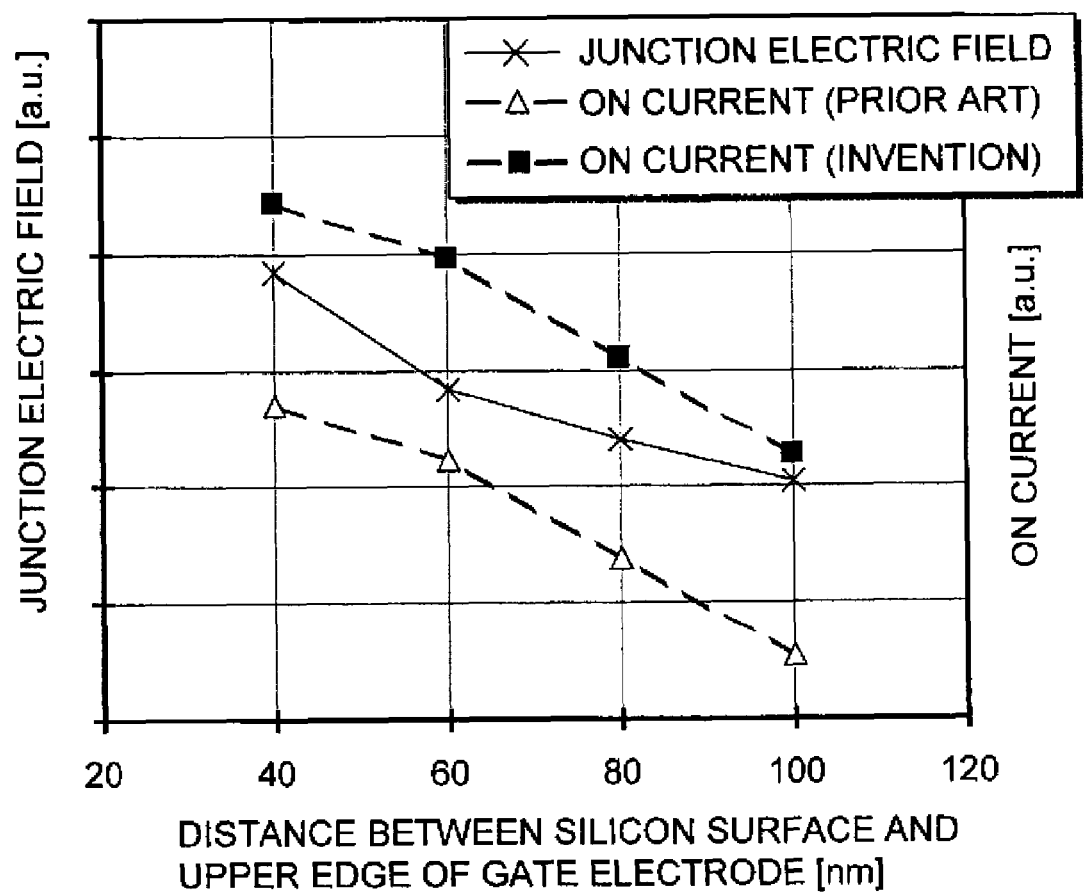
FIG. 40 is a graph illustrating relationships of a junction electric field and on-current with a distance between a silicon surface and an upper edge of a gate electrode in an embedded gate type Fin-FET according to the second embodiment.

Further, when Embedded-Gate Fin-FET is used as a memory cell transistor of DRAM, there is a need to reduce a junction electric field by increasing a distance between an upper edge of a gate electrode and diffusion layers (source and drain) to which a capacitor is electrically connected. As shown in FIG. 40, an embedment depth of the gate electrode is inversely proportional to an junction electric field and, hence, in order to satisfy a retention property requirement of DARM, it is preferable that the gate electrode is embedded so that a distance between a silicon surface (surface of Fin structure) and an upper edge of the gate electrode is 70 nm or more. However, in case that the gate electrode is deeply embedded, a distance between an upper edge of a gate electrode and a source/drain to which the capacitor is connected becomes larger. Hence, resistances of the source/drain diffusion layers to which the capacitor is connected will increase. Dependency of the on-current on a width of the active region is larger in such an embedded gate type transistor due to increase of the resistances than in a non-embedded gate type transistor.

In the present invention, the fin width of the channel region can be adjusted without reducing the width of the active region in the source and drain diffusion layers, so that even in Embedded-Gate Fin-FET, the decreasing of the on-current can be effectively suppressed as shown in FIG. 40.

Although the above description has explained the present invention only by way of the examples in which Trench-Gate Fin-FET is applied to a cell transistor of DRAM memory cell, the present invention is not limited to such an example and, rather, the present invention is applicable to all of semiconductor devices using Trench-Gate Fin-FET.

Moreover, the present invention includes following manufacturing methods as major points:

I. A method of manufacturing a semiconductor device, comprising:

forming, on a semiconductor substrate, a semiconductor region of Fin structure in which a width of a portion belonging to a lower channel region is smaller than a width of an upper active region;

filling a space around the semiconductor region with an insulating film for isolating each other;

forming a trench which intersects the semiconductor region and reaches at least the portion of the lower channel region having the smaller width; and forming a gate electrode with intervening a gate insulating film in the trench.

II. The method described in I, wherein forming the semiconductor region of the Fin structure comprises:

forming a hard mask layer on the semiconductor substrate and, then, patterning the mask layer in active region shape;

etching the semiconductor substrate using the patterned mask layer as a mask to form a first Fin structure;

forming side wall spacers on side faces of the first Fin structure;

further etching the semiconductor substrate using the hard mask layer and the side wall spacers as a mask to form a second Fin structure; and performing an isotropic etching of the second Fin structure using the hard mask layer and the side wall spacers as a mask to form a third Fin structure having the portion which belongs to the channel region and whose width is smaller than the width of the active region which is surrounded by the side wall spacers.

III. The method described in I, wherein forming the semiconductor region of the Fin structure comprises:

forming a hard mask layer on the semiconductor substrate and, then, patterning the mask layer in active region shape;

etching the semiconductor substrate using the patterned mask layer as a mask to form a first Fin structure;

forming side wall spacers on side faces of the first Fin structure;

further etching the semiconductor substrate using the hard mask layer and the side wall spacers as a mask to form a second Fin structure;

performing a thermal oxidation of exposed surfaces of the semiconductor substrate to form a silicon oxide film; and removing the silicon oxide film formed by the thermal oxidation to form a third Fin structure having the portion which belongs to the channel region and whose width is smaller than the width of the active region which is surrounded by the side wall spacers.

IV. The method described in I to III, wherein a width of the portion which belongs to the channel region is one-half or less of the width of the active region.

V. The method described in I to IV, wherein at least two trenches for gate electrodes in the semiconductor region of one fin structure are formed.

VI. The method described in I to V, wherein the gate electrode structure is a recessed gate which protrudes from the trench formed in the semiconductor region of the Fin structure in an upward direction of the Fin structure.

VII. The method described in VI, further comprising forming side wall spacers on side faces of the protruding gate electrode and, then, stacking semiconductor layers on an exposed top of the Fin structure and, then, implanting ions into the stacked semiconductor layers to form diffusion layers of a transistor.

VIII. The method described in I to VII, where the gate electrode structure is an embedded gate which is embedded in the trench formed in the semiconductor region of the Fin structure and in a lower place than a surface of the Fin structure.

IX. The method described in VIII, comprising forming at both sides of the embedded gate, diffusion layers having a different junction depth.

X. The method described in I to IX, further comprising forming a capacitor electrically connected to one of the diffusion layers of the Trench-Gate Fin-FET, and forming a bit line electrically connected to the other of the diffusion layers.

What is claimed is:

1. A device comprising:
a semiconductor substrate;
an isolation region formed on the semiconductor substrate;
a semiconductor region surrounded with the isolation region on the semiconductor substrate and prolonged in a first direction, the semiconductor region including a first active region, a channel region, and a second active region arranged in that order and in the first direction, the channel region including a top surface, a first side surface, and a second side surface,
the first side surface being extended downwardly from a first end of the top surface in a second direction different from the first direction, the second side surface being extended downwardly from a second end of the top surface in the second direction,
the first side surface facing to the second side surface, and
a gate electrode covering the top, first, and second side surfaces;
a first diffusion layer formed in the first active region; and
a second diffusion layer formed in the second active region,
wherein a width from the first and second side surfaces of the channel region in the second direction is a width of the first active region in the second direction, and
wherein the channel region is smaller in width by the second direction than one-half of that of the first active region.

2. The device according to claim 1, wherein a bottom of the isolation region is greater in depth than a bottom of the gate electrode.

3. The device according to claim 2, wherein the first active region includes a portion apart from the first diffusion layer, the portion of the first active region is nearly equal in width in the second direction to a width of the semiconductor region.

4. The device according to claim 1, wherein the gate electrode buries the isolation region, and extends from the semiconductor region to the isolation region continuously.

5. A device comprising:
a semiconductor substrate;
an isolation region formed on the semiconductor substrate;
a semiconductor region surrounded with the isolation region on the semiconductor substrate and prolonged in a first direction, the semiconductor region including a first active region, a channel region, and a second active region arranged in that order and in the first direction, the channel region including a top surface, a first side surface, and a second side surface,
the first side surface being extended downwardly from a first end of the top surface in a second direction different from the first direction, the second side surface being extended downwardly from a second end of the top surface in the second direction, the first side surface facing to the second side surface, and a gate electrode covering the top, first, and second side surfaces;

a first diffusion layer formed in the first active region; and a second diffusion layer formed in the second active region, wherein a width from the first and second side surfaces of the channel region in the second direction is a width of the first active region in the second direction, and wherein a junction depth of the first diffusion layer is different from that of the second diffusion layer.

6. The device according to claim 5, further comprising:

an insular semiconductor body being stacked on the first diffusion layer.

7. The device according to claim 6, wherein the insular semiconductor body includes a single-crystal portion that grows up from an interface of the insular semiconductor body and the first diffusion layer.

8. The device according to claim 7, wherein the insular semiconductor body extends over the isolation region.

9. The device according to claim 5, further comprising:

a first contact plug connecting to the first diffusion layer;

a conductive layer connecting to the first contact plug;

a second contact plug connecting to the second diffusion layer; and a capacitor connecting to the second contact plug.

10. The device according to claim 9, wherein the gate electrode is a word line, the conductive layer is a bit line, and the capacitor is a storage element.

11. A device, comprising:

a semiconductor substrate;

an isolation region formed on the semiconductor substrate;

a semiconductor region surrounded with the isolation region;

a trench dividing the semiconductor region into first and second active regions, and provided in the isolation region, the trench being prolonged in a first direction, the first and second active regions being disposed in a second direction that intersects the first direction;

a channel region including first, second, and third portions that are disposed in a line in the second direction, each of the first and second portions being disposed downwardly from a bottom portion of the first and second active regions, respectively, the third portion being disposed at a bottom region of the trench, and protruding upwardly from a surface of an insulator of the isolation region to have a fin shape, the channel region having a channel width that is between the isolation regions in the first direction and that is smaller than that of the first active region in the first direction;

a gate electrode buried in the trench and at least covering the third portion of the channel region through a gate insulating film;

a first diffusion layer formed in the first active region; and a second diffusion layer formed in the second active region, and wherein the channel region is smaller in width by the first direction than one-half of that of the first active region.

12. The device according to claim 11, wherein the trench at the isolation region is greater in depth than the trench at the semiconductor region.

13. The device according to claim 12, wherein the trench at the isolation region is nearly equal in width to the trench at the semiconductor region.

* * * * *